(12) United States Patent
Tanaka et al.

(10) Patent No.: US 12,272,400 B2
(45) Date of Patent: Apr. 8, 2025

(54) SEMICONDUCTOR DEVICE AND SEMICONDUCTOR SYSTEM

(71) Applicant: RENESAS ELECTRONICS CORPORATION, Tokyo (JP)

(72) Inventors: Shinji Tanaka, Tokyo (JP); Yohei Sawada, Tokyo (JP); Masao Morimoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 220 days.

(21) Appl. No.: 18/163,590

(22) Filed: Feb. 2, 2023

(65) Prior Publication Data

US 2023/0253042 A1    Aug. 10, 2023

(30) Foreign Application Priority Data

Feb. 4, 2022  (JP) .................. 2022-016219

(51) Int. Cl.
| | | |
|---|---|---|
| *G11C 7/22* | (2006.01) | |
| *G11C 5/14* | (2006.01) | |
| *G11C 7/06* | (2006.01) | |
| *G11C 15/04* | (2006.01) | |

(52) U.S. Cl.
CPC .............. *G11C 15/04* (2013.01); *G11C 5/148* (2013.01)

(58) Field of Classification Search
CPC ......... G11C 15/04; G11C 5/148; G11C 7/227; G11C 11/419; G11C 7/06; G11C 7/1078; G11C 7/222; G11C 11/412; G11C 11/413; G06F 30/20
See application file for complete search history.

(56) References Cited

U.S. PATENT DOCUMENTS

| | | | |
|---|---|---|---|
| 8,400,803 B2 | 3/2013 | Akiyama | |
| 2002/0181264 A1* | 12/2002 | Yanagawa | G11C 15/04 |
| | | | 365/49.17 |
| 2003/0161194 A1* | 8/2003 | Ma | G11C 15/04 |
| | | | 365/200 |

(Continued)

FOREIGN PATENT DOCUMENTS

JP    2011-181147 A    9/2011

*Primary Examiner* — Hien N Nguyen
(74) *Attorney, Agent, or Firm* — Rimon P.C.

(57) ABSTRACT

A semiconductor device includes a memory array having a plurality of associative memory cells arranged in a matrix form for storing entries. The memory array is divided into a plurality of memory blocks for sequentially performing a retrieval operation along a column direction, and further includes a plurality of match lines corresponding to the respective memory blocks and provided correspondingly to each memory cell row, a plurality of search lines corresponding to the respective memory blocks and provided correspondingly to each memory cell column, and a plurality of match amplifiers corresponding to the respective memory blocks and provided to the plurality of match lines. The match line provided correspondingly to the preceding memory block is set to become shorter than the match line provided correspondingly to the subsequent memory block. The memory array further includes a timing control unit for controlling timing for driving the search line of the subsequent memory block based on a length of the match line provided correspondingly to the preceding memory block.

8 Claims, 13 Drawing Sheets

(56) References Cited

U.S. PATENT DOCUMENTS

| | | | |
|---|---|---|---|
| 2003/0165073 A1* | 9/2003 | Lien | G11C 29/816 |
| | | | 365/49.17 |
| 2003/0179623 A1* | 9/2003 | Inoue | G11C 15/043 |
| | | | 365/200 |
| 2005/0068839 A1* | 3/2005 | McKenzie | G11C 15/043 |
| | | | 365/232 |
| 2007/0247885 A1* | 10/2007 | Watanabe | G11C 7/14 |
| | | | 365/49.17 |
| 2008/0232148 A1* | 9/2008 | Yabe | G11C 15/046 |
| | | | 365/49.1 |
| 2014/0313807 A1* | 10/2014 | Akiyama | G11C 15/00 |
| | | | 365/49.15 |

* cited by examiner

| SRAM CELL (X CELL) | SRAM CELL (Y CELL) | TCAM CELL DATA |
|---|---|---|
| "1" | "0" | "0" |
| "0" | "1" | "1" |
| "0" | "0" | "x"(don't care) |
| "1" | "1" | UNUSED |

SEMICONDUCTOR DEVICE AND SEMICONDUCTOR SYSTEM

CROSS-REFERENCE TO RELATED APPLICATIONS

The present application claims priority from Japanese Patent Application No. 2022-016219 filed on Feb. 4, 2022, the content of which is hereby incorporated by reference to this application.

BACKGROUND

This disclosure relates to a semiconductor device including a memory cell(s).

A storage device called a retrieval memory or CAM (Content Addressable Memory) retrieves a data word that matches a retrieval word from stored data words and outputs, if the matching data word is found, its address.

The CAM includes a BCAM (Binary CAM) and a TCAM (Ternary CAM). Each memory cell of the BCAM stores information on either "0" or "1". Meanwhile, in a case of the TCAM, each memory cell can store information on "don't care" (in this example, symbol "*" is used) besides "0" and "1". The symbol "*" indicates that either "0" or "1" is acceptable.

TCAM devices are widely used for address search and access control in routers for a network such as the Internet. In order to handle a large capacity, the TCAM device usually has a plurality of arrays and is configured so that search operations are performed simultaneously to the respective arrays.

Since the TCAM device can compare search data (input packets) and TCAM cell data all together, it is faster than a RAM (Random Access Memory) in use for all search applications.

Specifically, the TCAM device has a match line (ML) comparing information stored in the memory cells with data, which a user wants to retrieve, and indicating whether the both pieces of data are a match or a mismatch. Then, it outputs address information (Hit Index) corresponding to the match line of the data match.

Meanwhile, there is a problem in that a search operation needs large power consumption in order to set the match line of the data mismatch to a low potential.

SUMMARY

In this respect, a method disclosed in Patent Document 1 (Japanese Patent Application Laid-open No. 2011-181147) has a problem in that an array is divided into two to speed up a search operation of the subsequent array based on a search result of the preceding array.

The present disclosure has been made to solve the above problems, and provides a semiconductor device and a semiconductor system that are capable of reducing power consumption and performing high-speed search operations.

Other problems and novel features will be apparent from the descriptions of the present specification and the accompanying drawings.

A semiconductor device according to one aspect includes: a memory array including a plurality of associative memory cells arranged in a matrix form for storing entries. The memory array is divided into a plurality of memory blocks that sequentially perform a retrieval operation along a column direction, and the memory array further includes: a plurality of match lines provided correspondingly to the respective memory blocks and correspondingly to each of memory cell rows; a plurality of search lines provided correspondingly to the respective memory blocks and correspondingly to each of memory cell columns; and a plurality of match amplifiers corresponding to the respective memory blocks and respectively provided in the plurality of match lines. The match lines provided correspondingly to the preceding memory block is set to be shorter than the match line provided correspondingly to the subsequent memory block. The memory array further includes a timing control unit for controlling timing of driving the search line of the subsequent memory block based on a length of the match line provided correspondingly to the preceding memory block.

According to one embodiment, a semiconductor device of the present disclosure can reduce power consumption and perform high-speed search operations.

DETAILED DESCRIPTION

Figure 1:
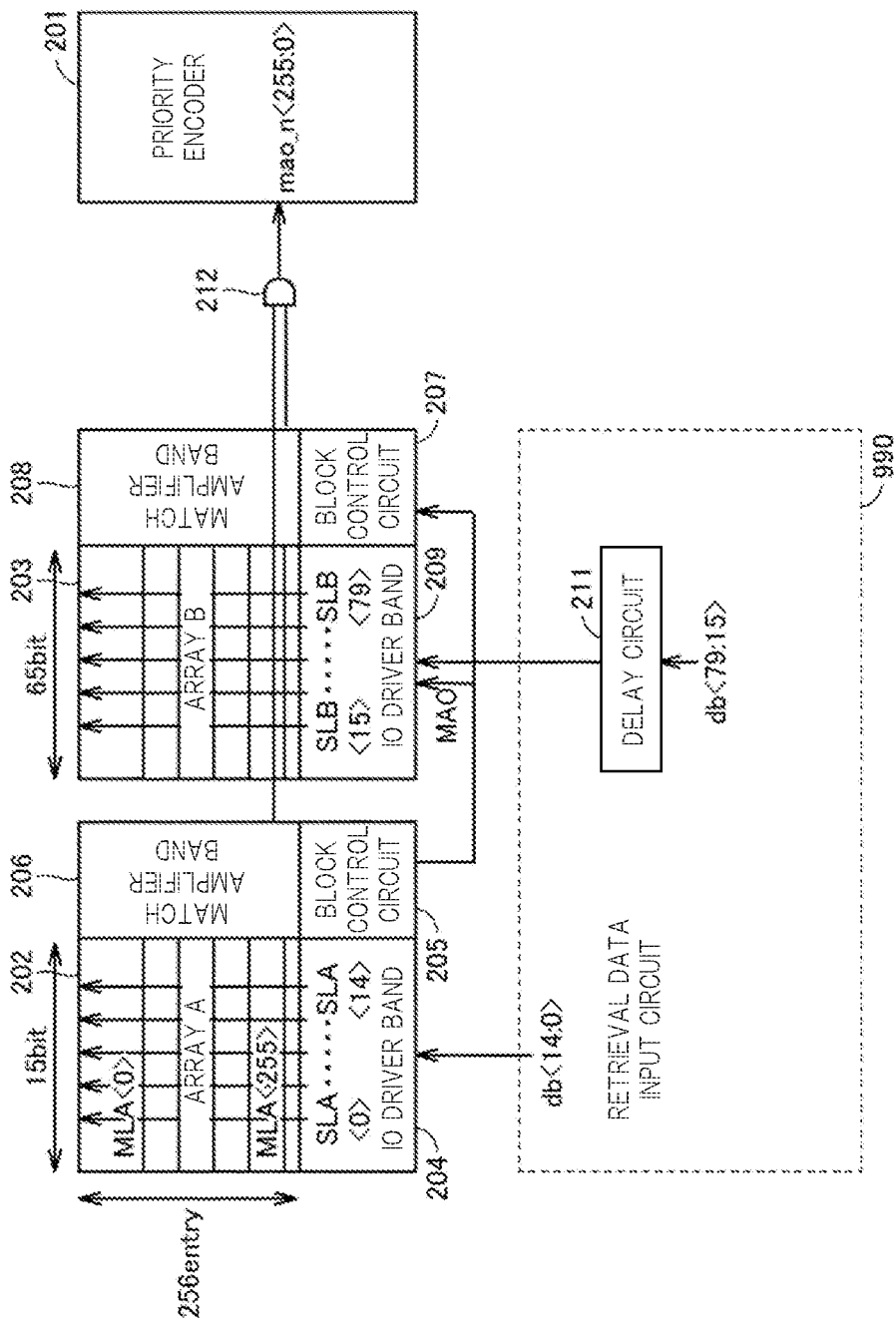
FIG. 1 is a diagram for explaining an overall configuration of a semiconductor device based on a first embodiment.

Embodiments will be detailed with reference to the drawings. Incidentally, the same or corresponding parts in the drawings are denoted by the same reference numerals, and a description thereof will not be repeated.

First Embodiment

In an embodiment, described will be a case where a memory array including a plurality of associative memory cells arranged in a matrix form (rows and columns) for storing entries is divided into a plurality of memory blocks that sequentially perform retrieval operations along a column direction.

FIG. 1 is a diagram for explaining an overall configuration of a semiconductor device based on a first embodiment.

As shown in FIG. 1, an associative storage device (content addressable memory) will be described as one example of a semiconductor device.

An associative storage device includes a plurality of memory blocks 202, 203, a retrieval data input circuit 990, a priority encoder 201, and an integrated circuit 212.

The retrieval data input circuit 990 divides 80-bit search data db <79:0> into first data <14:0> and second data <79:15>, and provides the first data to an IO driver band 204 and, after delaying the second data by a predetermined time (one cycle), provides it to an IO driver band 209.

In this example, the search data input circuit 990 includes a delay circuit 211.

A memory array (80 bits×256 entries) is divided into the memory block 202 (first half 15 bits×256 entries) and the memory block 203 (second half 65 bits×256 entries).

The memory block 202 includes an array A, a match amplifier band 206 adjacent to the array A in a column direction, an IO driver band 204 adjacent to the array A in a row direction, and a block control circuit 205 adjacent to the match amplifier band 206 and the IO driver band 204.

The array A has associative memory cells (TCAM cells) arranged in a matrix form.

The array A is divided into a plurality of entries in terms of row, and is provided with a match line MLA in which cells in the corresponding entry are coupled in parallel for each entry. Further, the array A is provided with a search line pair SLA (SL, /SL) for transmitting the retrieval data in the column direction. The TCAM cell is provided correspondingly to an intersecting portion of this search line pair SLA and the match line MLA.

The match amplifier band 206 includes match amplifiers provided correspondingly to the respective entries. The match amplifier is coupled to the match line MLA of the corresponding entry and determines a match/mismatch between the retrieval data in the array A and the stored data of each entry.

The IO driver band 204 includes a search line driver for each search line SL. The IO driver band receives 15-bit retrieval data db <14:0> externally. The search line driver applies a voltage Vcc or a fixed voltage Vss to the corresponding search line SL according to external retrieval data db <i>.

The block control circuit 205 controls components in the memory block 202.

The memory block 203 includes an array B, a match amplifier band 208 adjacent to the array B in the column direction, an IO driver band 209 adjacent to the array B in the row direction, a block control circuit 207 adjacent to the match amplifier band 208 and the IO driver band 209.

The array B has the associative memory cells (CAM cells) arranged in a matrix form.

The array B is divided into a plurality of entries in terms of row, and is provided with a match line MLB in which cells in the corresponding entry are coupled in parallel for each entry. Further, the array B is provided with a search line pair SLB (SL, /SL) for transmitting the retrieval data in the column direction of the array B. The TCAM cell is provided correspondingly to an intersecting portion of the search line pair SLB and the match line MLB.

A match amplifier band 208 includes a match amplifier provided correspondingly to each entry. The match amplifier is coupled to the match line MLB of the corresponding entry and determines a match/mismatch between the retrieval data in the array B and the stored data of each entry.

An IO driver band 209 includes a search line driver for each search line SL. The IO driver band receives 65-bit retrieval data db <79:15> via the delay circuit 210 externally. The search line driver applies a VDD voltage or a ground voltage to the corresponding search line SL according to external retrieval data db <i>.

The block control circuit 207 controls components in the memory block 203.

The integrated circuit 212 outputs a retrieval determination signal mao_n representing a retrieval result of the array A and the array B as a whole. Specifically, the integrated circuit 212 integrates a result of the match/mismatch of the corresponding entry in the memory block 202 and a result of the match/mismatch of the corresponding entry in the memory block 203 and outputs, as retrieval determination signals mao_n [0] to mao_n [255], the integrated results to the priority encoder 201.

The priority encoder 201 receives the retrieval determination signals mao_n [0] to mao_n [255] from all the entries. The priority encoder 201 outputs an address of the entry having the highest priority among the entries that output the "H"-level retrieval determination signals.

[Array Configuration]

Figure 2:
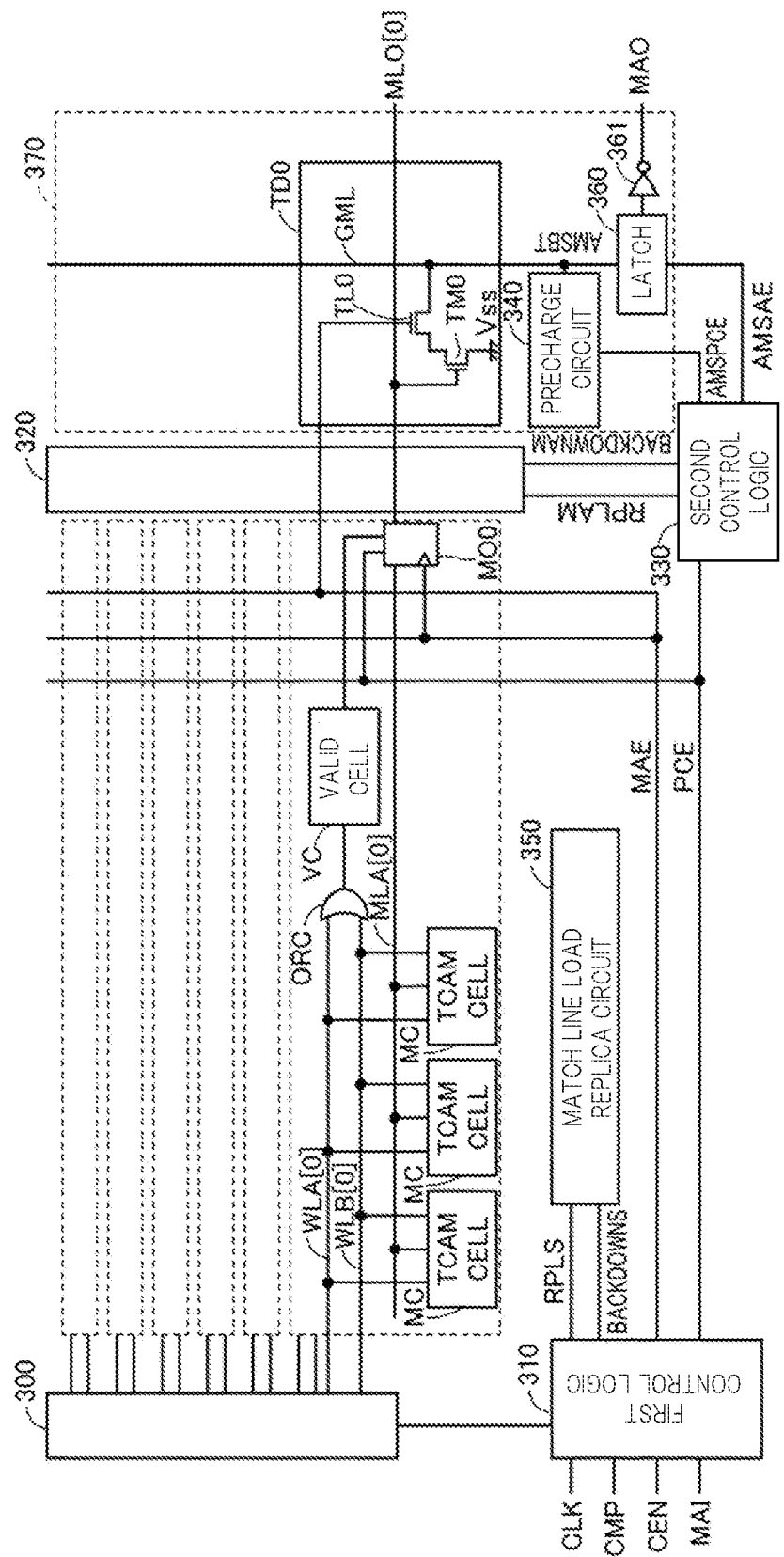
FIG. 2 is a diagram for explaining an array configuration and a block control circuit based on the first embodiment.

FIG. 2 is a diagram for explaining an array configuration and a block control circuit based on the first embodiment.

As one example, configurations of the array A and the block control circuit 205 will be described. Configurations of the array B and the block control circuit 207 are basically the same, too.

Referring to FIG. 2, the array A is divided for each entry, and each entry has a plurality of TCAM cells MC. As one example, one entry in the array A is composed of 15 bits.

Match lines MLA are provided correspondingly to a plurality of TCAM cells included in a memory cell row provided along the column direction.

Word lines WLA and WLB are provided correspondingly to the memory cell rows, respectively.

As one example, here, a word line WLA [0] and a word line WLB [0] are shown. Moreover, a case where a match line MLA [0] is provided is shown. Each entry includes an OR circuit ORC for outputting an OR logic operation result of the word lines WLA, WLB, a valid cell VC, and a match line output circuit MO0.

The valid cell VC stores a valid bit indicating whether the corresponding entry is valid or invalid.

Further, the array A includes a word line driver 300 for driving the word lines WLA, WLB of FIG. 2.

The block control circuit 205 includes a first control logic circuit 310, a match amplifier load replica circuit 320, a second control logic circuit 330, a determination circuit 370 for determining that all of some entries (15 bits) stored in the memory block 202 are a mismatch during a retrieval operation, and a match line load replica circuit 350.

The determination circuit 370 includes a precharge circuit 340, a latch circuit 360, an inverter 361, a determination line GML, and a plurality of determination units TD. Each determination unit TD is provided correspondingly to the match line output circuit MO including the match amplifier. As one example, the determination unit TD0 is provided correspondingly to the match line output circuit MO0 including the match amplifier that is provided correspondingly to the match line MLA [0].

The determination unit TD0 includes N-channel MOS transistors TL0, TM0.

The N-channel MOS transistors TL0 and TM0 are connected in series between the determination line GML and a ground potential (voltage Vss level). A gate of the N-channel MOS transistor TL0 is connected to the match signal output line MLO [0]. The N-channel MOS transistor TL0 receives an input of a control signal MAE.

An operation of the determination unit TD0 will be described.

The determination line GML is precharged by the precharge circuit 340. Specifically, it is precharged to a power supply potential (voltage Vcc level). The N-channel MOS transistor TL0 is turned on according to the input of the control signal MAE ("H" level). Then, the N-channel MOS transistor TM0 is turned on according to a potential of the match signal output line MLO [0].

Specifically, if the match signal output line MLO [0] is at an "H" level, the N-channel MOS transistor TM0 is turned on. Consequently, the determination line GML is drawn to the ground potential (voltage Vss). Meanwhile, if the match signal output line MLO [0] is at an "L" level, the N-channel MOS transistor TM0 is kept in an off-state.

The latch circuit 360 latches a control signal AMSBT based on the potential of the determination line GML in response to an input of a control signal AMSAE, and outputs it as a determination signal MAO via an inverter 361.

For example, when at least one match signal output line MLO is at the "H" level, that is, when some entries are a match, the determination line GML becomes the ground potential (voltage Vss level) and the control signal AMSBT is set to an "L" level. In this case, the determination signal MAO is at the "H" level. The subsequent retrieval operation is controlled according to the above-mentioned determination signal MAO. A retrieval operation of the subsequent memory block 203 is performed according to the determination signal MAO ("H" level).

Meanwhile, when all the match signal output lines MLO are at the "L" level, that is, when all of some entries are a mismatch, the determination line GML maintains the power supply potential (voltage Vcc level). The control signal AMSBT is set to an "H" level. In this case, the determination signal MAO is at the "L" level. The retrieval operation of the subsequent memory block 203 is stopped according to the determination signal MAO ("L" level).

The first control logic circuit 310 outputs various control signals for operating circuits inside the block based on inputs of various control signals. Specifically, the first control logic circuit 310 receives inputs of a clock signal CLK, a control signal CMP, a control signal CEN, and a control signal MAI. The first control logic circuit 310 outputs a control signal RPLS to the match line load replica circuit 350.

A control signal WEN is a control signal for distinguishing between a read command and a write command, the clock signal CLK is a reference clock signal for a read operation, and the control signal CEN is a control signal for controlling validity/invalidity of the clock signal CLK.

The control signal CMP is a control signal for controlling a retrieval operation, and a control signal RTE is a control signal for controlling resetting of the valid cells.

During the search operation, the first control logic circuit 310 receives the control signal CMP, and outputs the control signal to the search line driver, thereby controlling an operation of the search line driver. The first control logic circuit 310 controls an operation of the word line driver 300 by outputting the control signal to the word line driver 300 during a write operation. In addition, the block control circuit 205 outputs the control signal to the word line driver 300 and the sense amplifier during the read operation, thereby controlling the operations of the word line driver 300 and the sense amplifier.

A match line output circuit MO is provided correspondingly to the match line MLA provided correspondingly to the memory cell row.

The match line output circuits MO are respectively connected to the corresponding match lines MLA, and outputs of the match line output circuits MO are connected to the corresponding match signal output lines MLO. The match line output circuit MO receives a valid bit VB from the corresponding valid cell VC. An operation of the match line output circuit MO is controlled by a value of the valid bit VB.

The match line output circuit MO generates a detection signal indicating whether the cell data and the input search data, which correspond to each other, are the match or mismatch based on the potential of the corresponding match line ML during the search operation, and outputs it to the corresponding match signal output line MLO. When the valid bit VB indicates validity, a signal level of the match signal output line MLO is set to a level of the detection signal indicating whether the corresponding cell data and the input search data are match or mismatch (match: "H" level or mismatch: "L" level). Meanwhile, when the valid bit VB indicates invalidity, the signal level of the match signal output line MLO is irrelevant to the detection signal indicating whether the corresponding cell data and a corresponding portion of the input search data are a match or not, and is, for example, set to a signal level indicating the mismatch ("L" level).

The match line load replica circuit 350 receives the input of the control signal RPLS, and outputs a first timing control signal BACKDOWNS based on a length of the match line ML. The match line load replica circuit 350 is a circuit for measuring timing for identifying the potential of the match line ML due to a load on the match line ML when the plurality of search lines are driven during the retrieval operation.

The first control logic circuit 310 outputs a control signal MAE and a control signal PCE according to the input of the first timing control signal BACKDOWNS.

The match amplifier load replica circuit 320 receives an input of a control signal RPLAM, and outputs a second timing control signal BACKDOWNAM based on the number of match amplifiers. The match amplifier load replica circuit 320 is a circuit for measuring timing for identifying the potential of the determination line GML due to loads on the plurality of match amplifiers when the plurality of match amplifiers are driven during the retrieval operation.

The second control logic circuit 330 outputs the control signal RPLAM based on the control signal PCE outputted from the first control logic circuit 310, and outputs control signals AMSPCE and AMSAE according to the input of the second timing control signal BACKDOWNAM.

The second control logic circuit 330 outputs the control signal RPLAM to the match amplifier load replica circuit 320, receives the input of the second timing control signal BACKDOWNAM whose timing is adjusted by the match amplifier load replica circuit 320, and outputs the control signal AMSPCE and the control signal AMSAE.

[Configuration of TCAM Cell]

Figures 3, 4:
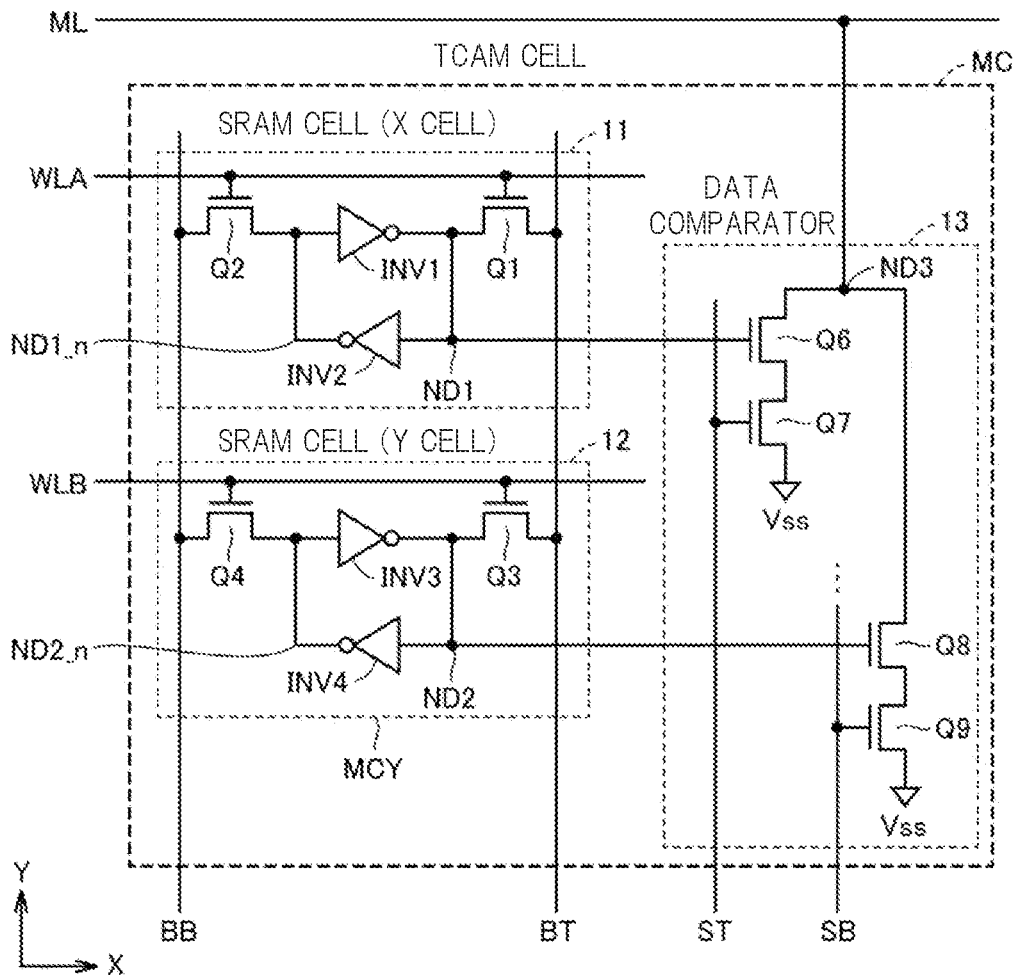
FIG. 3 is a circuit diagram showing one example of a configuration of a TCAM cell based on the first embodiment.
FIG. 4 is a diagram showing, in tabular form, a correspondence relationship between memory contents of an X cell and a Y cell and data of a TCAM cell based on the first embodiment.

FIG. 3 is a circuit diagram showing one example of a configuration of a TCAM cell based on the first embodiment.

Referring to FIG. 3, a TCAM cell (also called a memory cell MC) includes two SRAM cells (Static Random Access Memory Cells) 11, 12 and a data comparator 13. The SRAM cell 11 is also called an X cell, and the SRAM cell 12 is also called a Y cell. The X cell 11 stores 1-bit data complementary to each other (when one node is "1", the other node is "0") in internal memory node pair ND1, ND1_$n$. The Y cell 12 stores 1-bit data complementary to each other in internal memory node pair ND2, ND2_$n$.

The TCAM cell is connected to a bit line pair BT, BB, a search line pair ST, SB, a match line ML, and word lines WLA, WLB. The bit line pair BT, BB extends in a row direction (Y direction) of a TCAM cell array in FIG. 3, and is shared by the plurality of TCAM cells arranged in the row direction. The search line pair ST, SB extends in a column direction (X direction) of the TCAM cell array, and is shared by the plurality of TCAM cells arranged in the row direction.

The match line ML extends in the column direction (X direction) of the TCAM cell array, and is shared by the plurality of TCAM cells arranged in the column direction. The word lines WLA, WLB extend in the column direction (X direction) of the TCAM cell array, and are shared by the plurality of TCAM cells arranged in the column direction. The word lines WLA and WLB can also be called a first word line and a second word line, respectively.

The X cell 11 includes inverters INV1, INV2 and N-channel MOS (Metal Oxide Semiconductor) transistors Q1, Q2. The inverter INV1 is connected between a memory node ND1_$n$ and a memory node ND1 so that a direction from the memory node ND1_$n$ to the memory node ND1 becomes a forward direction. The inverter INV2 is connected in parallel with and in an opposite direction of the inverter INV1. The MOS transistor Q1 is connected between the memory node ND1 and the bit line BT. The MOS transistor Q2 is connected between the memory node ND1_$n$ and the bit line BB. Gates of the MOS transistors Q1, Q2 are connected to the word line WLA.

The Y cell 12 includes inverters INV3, INV4 and MOS (Metal Oxide Semiconductor) transistors Q3, Q4. The inverter INV3 is connected between a memory nodes ND2 and a memory node ND2_$n$ so that a direction from the memory node ND2_$n$ to the memory node ND2 becomes a forward direction. The inverter INV4 is connected in parallel with and in an opposite direction to the inverter INV3. The MOS transistor Q3 is connected between the memory node ND2 and the bit line BT. The MOS transistor Q4 is connected between the memory node ND2_$n$ and the bit line BB. Gates of the MOS transistors Q3, Q4 are connected to the word line WLB.

The data comparator 13 includes N-channel MOS transistors Q6 to Q9. The MOS transistors Q6, Q7 are connected in series between a node ND3, which is a connecting point with the match line ML, and a ground node GND. Th MOS transistors Q8, Q9 are connected in series between the node ND3 and the ground node GND, and are connected in parallel with all of the series-connected MOS transistors Q6, Q7. Gates of the MOS transistors Q6, Q8 are connected to the memory nodes ND1, ND2, respectively. Gates of the MOS transistors Q7, Q9 are connected to the search lines ST, SB, respectively.

Each of the inverters INV1, INV2, INV3, and INV4 has a P-channel MOS transistor and an N-channel MOS transistor. A source-drain path of the P-channel MOS transistor and a source-drain path of the N-channel MOS transistor are connected in series between a first power supply potential Vcc and a second power supply potential Vss. A gate of the P-channel MOS transistor and a gate of the N-channel MOS transistor are commonly connected to form an input terminal of the inverter. A drain of the P-channel MOS transistor and a drain of the N-channel MOS transistor are commonly connected to form an input terminal of the inverter.

Incidentally, the memory cell of the BCAM can be configured by, for example, deleting the word line WLB and the Y cell in FIG. 3 and connecting a gate electrode of the MOS transistor Q8 to the memory node ND1_$n$ of the X cell.

FIG. 4 is a diagram showing, in tabular form, a correspondence relationship between memory contents of the X and Y cells and the data of the TCAM cell based on the first embodiment.

Referring to FIGS. 3 and 4, the TCAM cell can store three values of "0", "1", and "x" (don't care) by using a 2-bit SRAM cell. Specifically, when "1" is stored in the memory node ND1 of the X cell 11 and "0" is stored in the memory node ND2 of the Y cell 12, it is assumed that "0" is stored in the TCAM cell. When "0" is stored in the memory node ND1 of the X cell 11 and "1" is stored in the memory node ND2 of the Y cell 12, it is assumed that "1" is stored in the TCAM cell. When "0" is stored in the memory node ND1 of the X cell 11 and "0" is stored in the memory node ND2 of the Y cell 12, it is assumed that "x" (don't care) is stored in the TCAM cell. When "1" is stored in the memory node ND1 of the X cell 11 and "1" is stored in the memory node ND2 of the Y cell 12, the TCAM cell is not used.

According to the above-mentioned configuration of the TCAM cell, the search data is "1" (that is, the search line ST is "1" and the search line SB is "0") and the TCAM data is "0" (the memory node ND1 is "1" and the memory node ND2 is "0"), the potential of the precharged match line ML is drawn to the ground potential in order to make the MOS transistors Q6, Q7 on-states. When the search data is "0" (that is, the search line ST is "0" and the search line SB is "1") and the TCAM data is "1" (the memory node ND1 is "0" and the memory node ND2 is "1"), the potential of the pre-charged (voltage Vcc level) match line ML is drawn to the ground potential in order to make the MOS transistors $Q_8$, $Q_9$ on-states. That is, when the search data and the TCAM data are mismatch, the potential of the match line ML is drawn to the ground potential (voltage VSS level).

Conversely, if the inputted search data is "1" and the TCAM data is "1" or "x" or if the search data is "0" and the TCAM data is "0" or "X" (that is, when both are a match), the potential of the precharged match line ML (voltage Vcc level) is maintained.

As described above, unless the data of all the TCAM cells connected to the match line ML corresponding to one entry (row) matches the input search data, electric charges accumulated in the match line ML are extracted.

Figure 5:
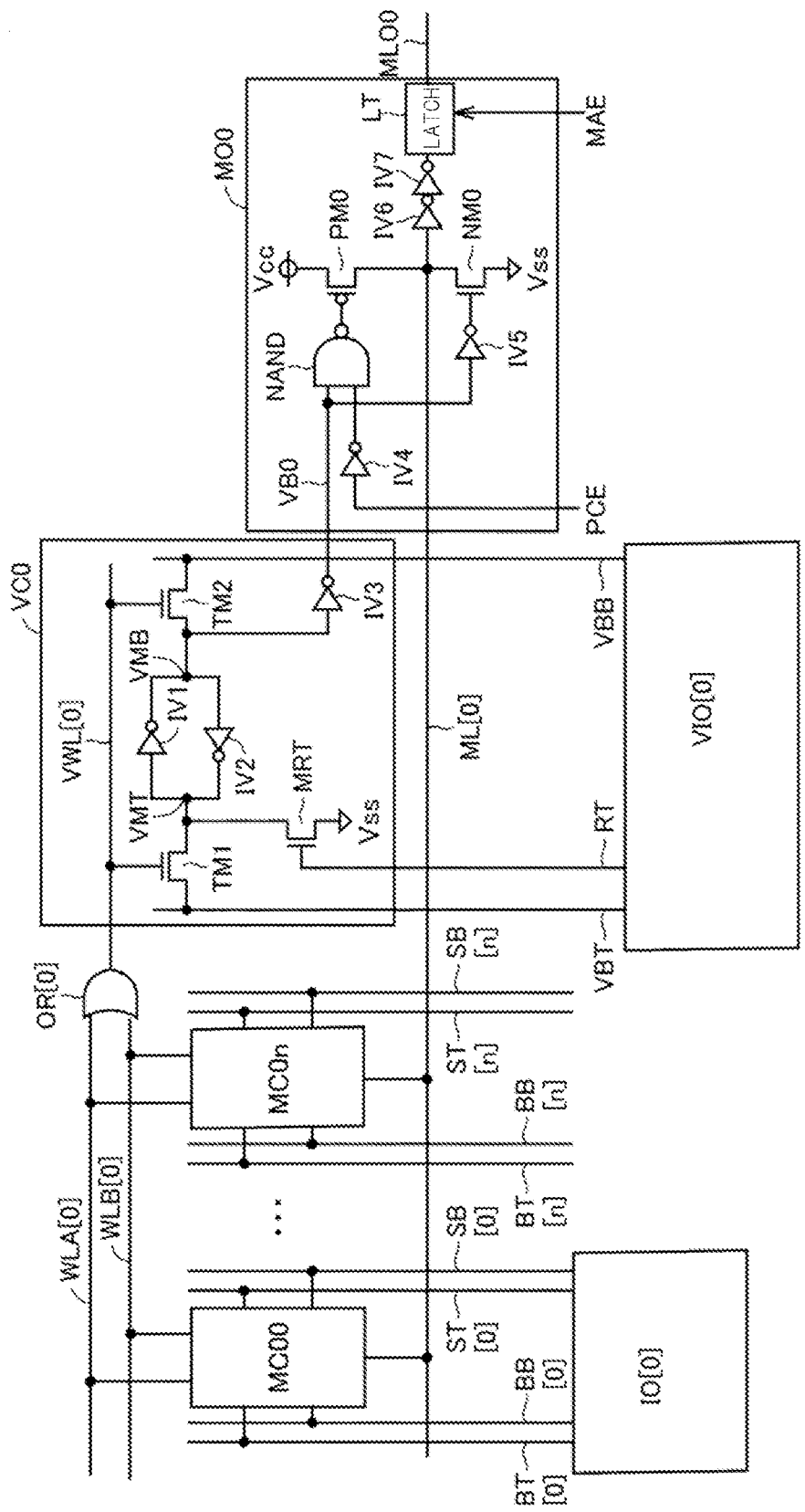
FIG. 5 is a diagram showing one example of a circuit configuration corresponding to one entry based on the first embodiment.

FIG. 5 is a diagram showing one example of a circuit configuration corresponding to one entry based on the first embodiment.

As shown in FIG. 5, in this example, configurations of memory blocks 202, 203 are basically the same.

TCAM cells MC00 to MC0$n$ are connected to word lines WLA [0], WLB [0] and a match line ML [0]. Each of the TCAM cells MC00 to MC0$n$ has each of the corresponding bit line pair (BT [0], BB [0] to BT [n], BB [n]) and the corresponding search line pair (ST [0], SB [0] to ST [n], SB [n]).

A valid cell VC0 includes a word line VWL (third word line) [0] and a bit line pair VBT, VBB. The valid cell VC0 includes inverters IV1, IV2, N-channel MOS (Metal Oxide Semiconductor) transistors TM1, TM2, and an inverter IV3. The inverter IV1 is connected between a memory node VMT and a memory node VMB so that a direction from the memory node (first memory node) VMT to the memory node (second memory node) VMB becomes a forward direction. The inverter IV2 is connected in parallel with and in an opposite direction to the inverter IV1. A source-drain path of a transfer MOS transistor (access transistor) TM1 is connected between the memory node VMT and the bit line VBT. A source-drain path of a transfer MOS transistor (access transistor) TM2 is connected between the memory node VMB and the bit line VBB. Gates of the MOS transistors TM1, TM2 are connected to the word line VWL [0]. The memory node VMT is further connected to a drain of a reset MOS transistor MRT receiving a reset signal RT. A source of the reset MOS transistor MRT is connected to the ground potential (voltage Vss level).

Incidentally, each of the inverters IV1, IV2 has a P-channel MOS transistor and an N-channel MOS transistor. A source-drain path of the P-channel MOS transistor and a source-drain path of the N-channel MOS transistor are connected in series between the power supply potential (voltage Vcc level) and the ground potential (voltage Vss level). A gate of the P-channel MOS transistor and a gate of the N-channel MOS transistor are commonly connected to form an input terminal of the inverter. A drain of the P-channel MOS transistor and a drain of the N-channel MOS transistor are commonly connected to form an input terminal of the inverter.

The word line VWL [0] is connected to an output of an OR circuit OR [0]. An input of the OR circuit OR [0] is connected to word lines WLA [0], WLB [0]. That is, the OR circuit OR [0] is connected to the first word line WLA [0] and the second word line WLB [0], and can be regarded as a selection circuit that makes a third word line VWL [0] a selected state according to the first word line or second word line being made a selected state.

A value of a memory node VMB of the valid cell VC0 is supplied as a valid bit VB0 to the match line output circuit MO0 via the inverter IV3. The inverter IV3 can be regarded as an output circuit of the memory node VMB.

The match line output circuit MO0 includes a NAND circuit NAND, a PMOS transistor PM0, an NMOS transistor NM0, and inverters IV5, IV6, and IV7. A first input of the NAND circuit NAND is connected to an output of the inverter IV3 to receive the valid bit VB0. A second input of the NAND circuit NAND receives a precharge signal PC via the inverter IV4. An output of the NAND circuit NAND is connected to a gate of the PMOS transistor PM0. A gate of the NMOS transistor NM0 receives an inverted signal of the valid bit VB0 via the inverter IV5. A source-drain path of the PMOS transistor PM0 and a source-drain path of the NMOS transistor NM0 are connected between the power supply potential (voltage Vcc level) and the ground potential (voltage Vss level). The match line ML [0] is connected to the drains of the PMOS transistor PM0 and the NMOS transistor NM0. The drains of the PMOS transistor PM0 and the NMOS transistor NM0 are also connected to the match signal output line MLO0 via the inverters IV6, IV7.

The match signal output line MLO0 is provided with a latch circuit LT, which is latched according to a control signal MAE.

Next, the write operation will be described.

In writing entry data to the TCAM cells MC00 to MC0n, the write is performed by supplying write data to the bit line pairs BT [0], BB [0] to BT [n], BB [n] while the word line WLA [0] or word line WLB [0] is in selected states. At this time, the word line VWL [0] of the valid cell VC0 is also made a selected state by the OR circuit OR [0], so that the write of the valid bit into the valid cell VC0 is possible by supplying the write data to the valid cell VC0 via the bit line pair VBT, VBB. When the memory nodes VMT, VMB are at the "H" level ("H") and the "L" level ("L"), that is, when the valid bit VB0 is at the "H" level ("H"), the valid cell VC0 indicates that the entry is valid. Meanwhile, when the memory nodes VMT, VMB are at the "L" level ("L") and the "H" level ("H"), that is, when the valid bit VB0 is at the "L" level ("L"), the valid cell VC0 indicates that the entry is invalid and valid.

Next, the retrieval operation will be described.

A comparison operation between the entry data stored in the TCAM cells MC00 to MC0n and the search data is performed by supplying the search data to the search line pair (ST [0], SB [0] to ST [n], SB [n]).

When the valid bit VB0 is at the "H" level ("H") and the precharge signal PC is in a standby state ("L" level), the PMOS transistor PM0 is an on-state and the NMOS transistor NM0 is an off-state. Therefore, the match line ML [0] is precharged to the "H" level.

When the valid bit VB0 is at the "H" level ("H") and the precharge signal PC is in an activated state ("H" level), the PMOS transistor PM0 is in an off-state and the NMOS transistor NM0 is in an off-state. Therefore, the match line ML [0] leads to being in a floating state. In this state, if the entry data and the search data are a match, a precharge potential of the match line ML [0] is maintained at the "H" level. As a result, the match signal output line MLO0 is set to the "H" level indicating the match. Meanwhile, if the entry data and the search data are a mismatch, the precharge potential of the match line ML [0] changes to the "L" level. As a result, the match signal output line MLO0 is set to the "L" level indicating the mismatch.

Meanwhile, when the valid bit VB0 is at the "L" level ("L"), the PMOS transistor PM0 is in the off-state and the NMOS transistor NM0 is in the on-state. Therefore, the potential of the match line ML [0] is set to the "L" level, and the match signal output line MLO0 is also set to the "L" level indicating the mismatch.

In resetting the memory contents of the valid cell VC0, the reset signal RT is set to an "H" level. Consequently, the reset MOS transistor MRT is made the on-state, so that the memory node VMT is set to the "L" level, the memory node VMB is set to the "H" level, and data indicating invalidity is stored in the valid cell VC0. In this case, as shown in FIG. 3, the plurality of valid cells VC0 to VCm are connected to a wiring(s) to which the reset signal RT is supplied, and activation like the "H" level of the reset signal RT makes it possible to collectively set the valid bits (VB0 to VBm), which are stored in the plurality of valid cells VC0 to VCm, to data indicating the invalidity like the "L" level.

One entry has been described in FIG. 5, but if the number of entries is made M+1, the plurality of valid cells VC0 to VCm are provided, so that the word lines VWL [0] to VWL [M] are provided.

Figure 6:
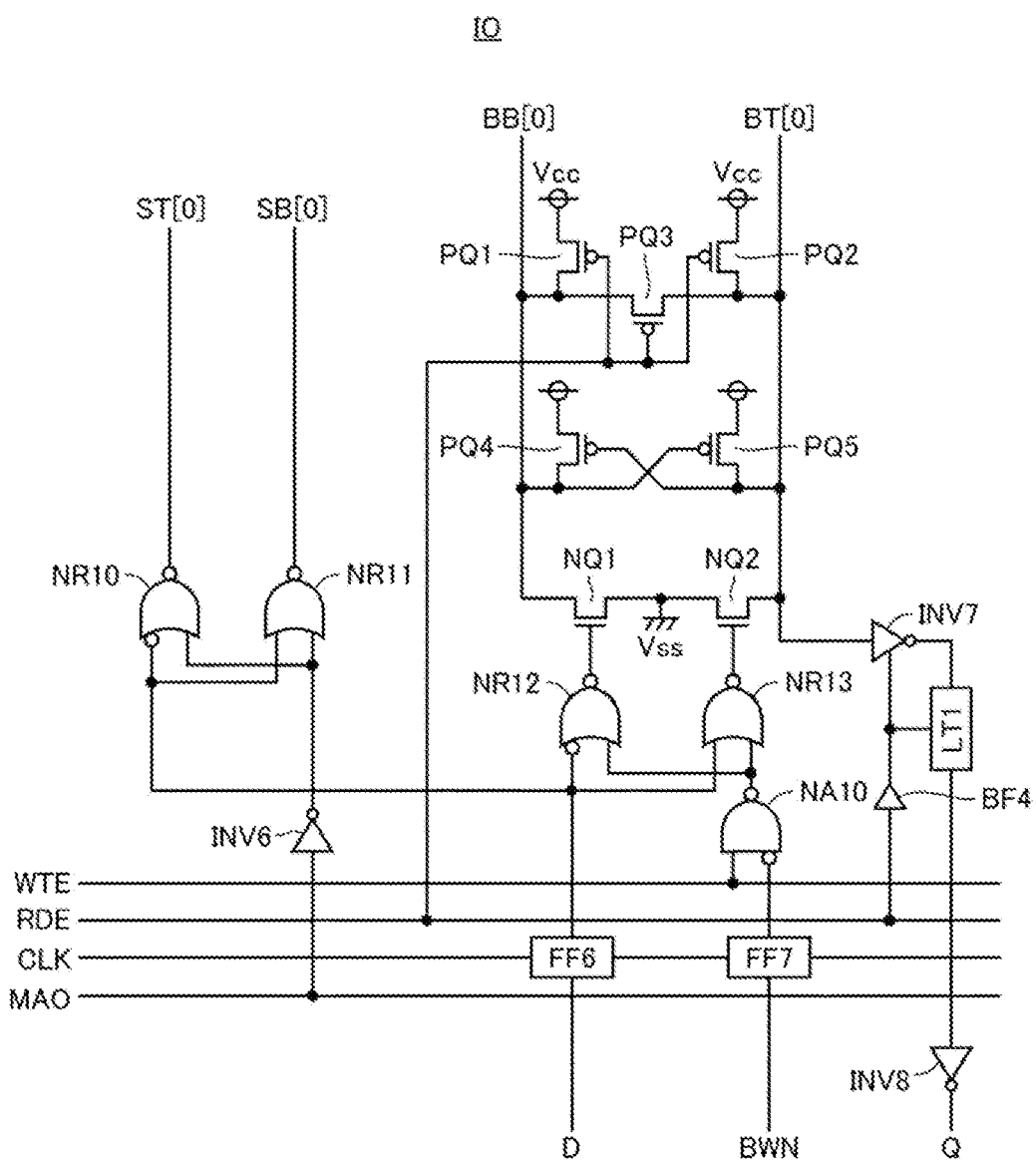
FIG. 6 is a diagram showing a circuit example of an IO circuit IO based on the first embodiment.

FIG. 6 is a diagram showing a circuit example of an IO circuit IO based on the first embodiment.

Referring to FIG. 6, an IO circuit (IO) is an input/output circuit for the TCAM cell MC, and is connected to: a clock terminal CLK; a data terminal D supplying write data or search data to the TCAM cell MC (MC00); a bit write mask terminal BWN; and a data output terminal Q to which the read data from the TCAM cell MC (MC00) is supplied.

The IO circuit (IO) is also adapted to receive each signal (WTE, RDE, RTE, MAO) from the block control circuit 205.

The IO circuit (IO) is connected to a search line pair ST [0], SB [0] and a bit line pair BT [0], BB [0].

The search line pair ST [0], SB [0] are respectively connected to output terminals of NOR circuits NR10, NR11, which serve as search line drivers SD. One input of the NOR circuits NR10, NR11 receives the determination signal MAO via the inverter circuit INV6. The search data supplied to the data terminal D can be supplied to the other inputs of the NOR circuits NR10, NR11 via a flip-flop FF6.

The supply of the search data to the search line pair ST [0], SB [0] is performed as follows. In this case, it is assumed that the determination signal MAO is set to a selection level like the "H" level, and the other control signals (RDE, WTE) are set to a non-selection level like the "L" level. The "H"-level search data supplied to the data terminal D is supplied to the flip-flop FF6, and is taken in by the clock signal CLK. An output of the flip-flop FF6 is supplied to the other inputs of the NOR circuits NR10, NR11. An output of the inverter circuit INV6 is set at the "L" level, and the "H"-level data and the "L"-level data are supplied to the output terminals of the NOR circuits NR10, NR11. In a case of the "L"-level search data supplied to the data terminal D, the "L"-level and the "H"-level data are supplied to the output terminals of the NOR circuits NR10, NR11.

A bit line pair BT [0], BB [0] is connected to N-channel MOS transistors NQ1, NQ2 serving as a write driver WD. Gates of the N-channel MOS transistors NQ1, NQ2 are connected to the outputs of NOR circuits NR12, NR13. A source-drain path of the N-channel MOS transistor NQ1 is connected between BB [0] and the ground potential (voltage Vss level), and a source-drain path of the N-channel MOS transistor NQ2 is connected between BT [0] and the ground potential (voltage Vss level). The write data supplied to the data terminal D is supplied to one input of each of the NOR circuits NR12, NR13 via the flip-flop FF6. The other input of each of the NOR circuits NR12, NR13 is connected to an output of the NAND circuit NA10. One input of the NAND circuit NA10 is connected to the control signal WTE, and the control signal BWN can be supplied to the other input of the NAND circuit NA10 via the flip-flop FF7.

When the control signal BWN is set to a selection level such as an "H" level, the gates of the N-channel MOS transistors NQ1, NQ2 are set to "L" levels and data write is masked even if the control signal WTE is set to a selection level such as an "H" level. That is, the data write is blocked.

Meanwhile, when the control signal BWN is set to a non-selection level such as an "L" level and the control signal WTE is set to a selection level such as an "H" level, the gates of the N-channel MOS transistors NQ1, NQ2 are set to levels such as the "L" and "H" levels or the "H" and "L" levels and are driven by the outputs of the NOR circuit NR12, NR13. Consequently, the level of the bit line pair BT [0], BB [0] is set to a level corresponding to the write data, and the write data is written to the TCAM cell (MC00) selected by the selected-state word line.

The bit line pair BT [0] is also connected to a data output terminal Q via the inverter circuit INV7, the latch circuit LT1, and the inverter circuit INV8 that serve as a read circuit SA. The inverter circuit INV7 and the latch circuit LT1 receive a control signal RDE via the buffer circuit BF4. The inverter circuit INV7 and the latch circuit LT1 are set to activated states by a selection level such as the "H" level of the control signal RDE, and supply read data of the TCAM cell (MC00), which has read out to the bit line pair BT [0], to the data output terminal Q.

Precharge transistors PQ1, PQ3, each of which is composed of a P-channel MOS transistor, and an equalize transistor PQ2 are connected to the bit line pair BT [0], BB [0]. Source-drain paths of the precharge transistors PQ1, PQ3 are connected between the power supply potential (voltage Vcc level) and the bit line pair BT [0], BB [0]. A source-drain path of the equalize transistor PQ2 is connected between a bit line BT [0] and a bit line BB [0]. Each gate of the precharge transistors PQ1, PQ3 and the equalize transistor PQ2 is connected to a control signal RDE. The precharge transistors PQ1, PQ3 and the equalize transistor PQ2 are set to an activated state by a non-selection level such as the "L" level of the control signal RDE.

The bit line pair BT [0], BB [0] is also connected to pull-up transistors PQ4, PQ5 composed of P-channel MOS transistors, respectively. A source-drain path of the pull-up transistor PQ4 is connected between the power supply potential (voltage Vcc level) and the bit line BB [0], and its gate is connected to the bit line BT [0]. A source-drain path of the pull-up transistor PQ5 is connected between the power supply potential (voltage Vcc level) and the bit line BT [0], and its gate is connected to the bit line BB [0].

The memory block 203 receives the input ("H" level) of the determination signal MAO from the preceding memory block 202 and executes a retrieval operation. The memory block 203 stops the retrieval operation when it receives the input ("L" level) of the determination signal MAO from the preceding memory block 202.

Since the memory block 202 does not have a preceding memory block, it receives the input ("H" level) of the determination signal MAO during the retrieval operation and executes the retrieval operation.

Figure 7:
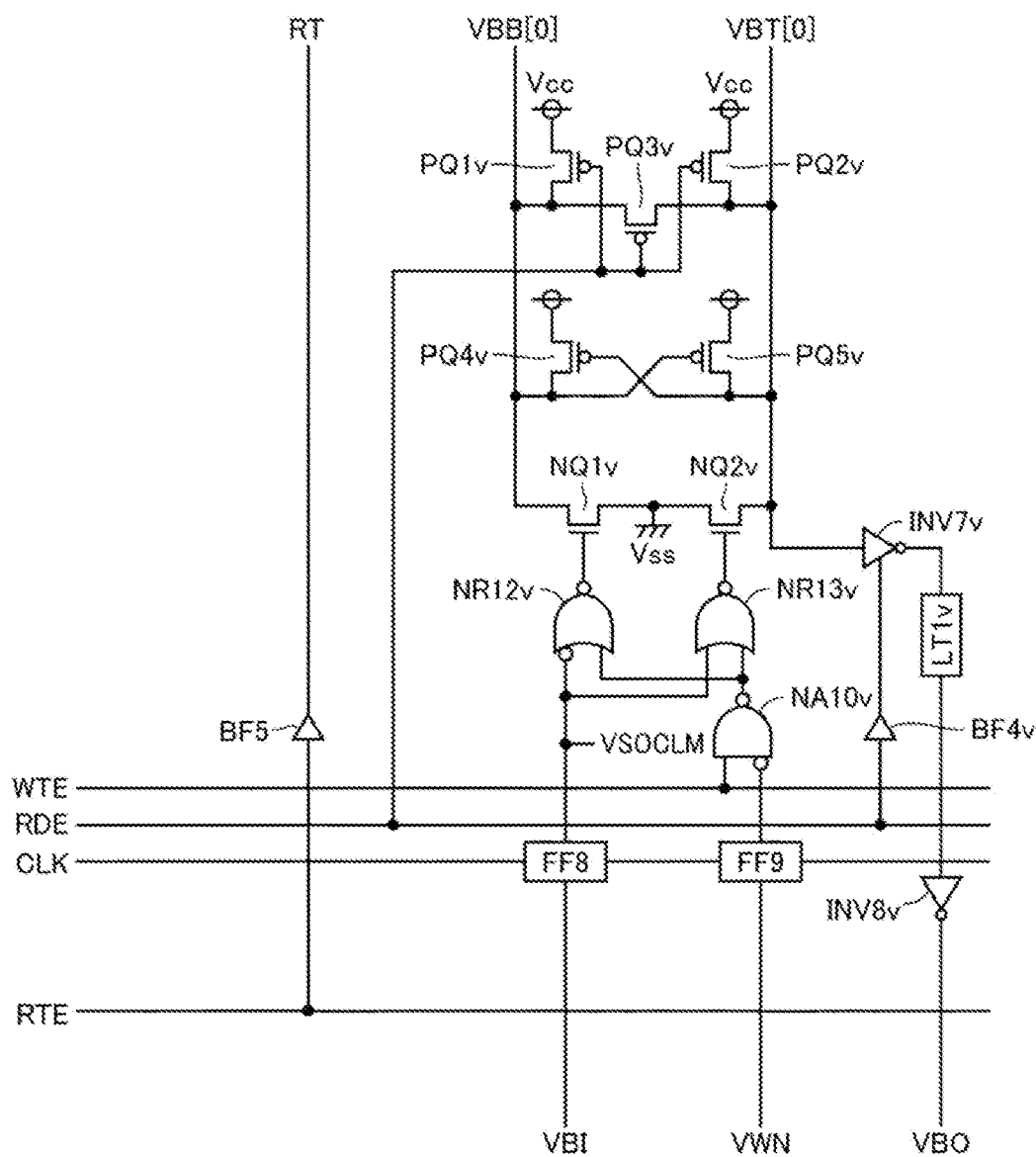
FIG. 7 is a diagram showing a circuit example of a VIO circuit VIO based on the first embodiment.

FIG. 7 is a diagram showing a circuit example of a VIO circuit VIO based on the first embodiment.

Referring to FIG. 7, a VIO circuit VIO is an input/output circuit for the valid cell VMC, and it is connected to a clock terminal CLK, a data terminal VBI supplying write date to a valid cell VC (VC0), a bit write mask terminal VWN, and a data output terminal VBO supplying read data from the valid cell VC (VC0).

The VIO circuit (VIO) receives each control signal (WTE, RDE, RTE) from the block control circuit 205. The VIO circuit (VIO) are also connected to a bit line pair VBT [0], VBB [0] to generate the control signal RT.

The bit line pair VBT [0], VBB [0] is connected to N-channel MOS transistors NQ1v, NQ2v serving as write drivers VWD. Gates of the N-channel MOS transistors NQ1v, NQ2v are connected to outputs of the NOR circuits NR12v, NR13v. A source-drain path of the N-channel MOS transistor NQ1v is connected between VBB [0] and the ground potential (voltage Vss level), and a source-drain path of the N-channel MOS transistor NQ2v is connected between VBT [0] and the ground potential (voltage Vss level). The write data (valid bit data) supplied to the data terminal VBI can be supplied to one input of each of the NOR circuits NR12v, NR13v via a flip-flop FF8.

The other input of each of the NOR circuits NR12v, NR13v is connected to the output of the NAND circuit NA10v. One input of the NAND circuit NA10v is connected to a write enable signal WTE, and the control signal VWN can be supplied to the other input of the NAND circuit NA10v via a flip-flop FF9.

When the control signal VWN is set to a selection level such as an "H" level, the gates of the N-channel MOS transistors NQ1v, NQ2v are set to the "L" levels even if the control signal WTE is set to a selection level such as an "H" level, and the data write is masked. That is, the data write is blocked.

Meanwhile, when the control signal VWN is set to a non-selection level such as an "L" level and the control signal WTE is set to a selection level such as an "H" level, the gates of the N-channel MOS transistors NQ1v, NQ2v are set to levels such as the "L" and "H" levels or the "H" and "L" levels by the output of the NOR circuits NR12v, NR13v and are driven. Consequently, the level of the bit line pair VBT [0], VBB [0] is set to a level corresponding to the write data, and the write data is written to the valid cell VC (VC0) selected by the selected-state word line VWL [0].

The bit line pair VBT [0] is also connected to a data output terminal VBO via the inverter circuit INV7v, the latch circuit LT1v, and the inverter circuit INV8v that serve as the read circuit VSA. The inverter circuit INV7v and the latch circuit LT1v receive the control signal RDE via the buffer circuit BF4v. The inverter circuit INV7v and the latch circuit LT1v are set to activated states by a selection level such as an "H" level of the read enable signal RDE, and the read data of the valid cell VC (VC0) read out to the bit line pair VBT [0] is supplied to the data output terminal VBO.

The bit line pair VBT [0], VBB [0] is also connected to precharge transistors PQ1v, PQ3v and an equalize transistor PQ2v, each of which is composed of a P-channel MOS transistor. Source-drain paths of the precharge transistors PQ1v, PQ3v are connected between the power supply potential (voltage Vcc level) and the bit line pair VBT [0], VBB [0]. A source-drain path of the equalize transistor PQ2v is connected between the bit line VBT [0] and the bit line VBB [0]. Each gate of the precharge transistors PQ1v, PQ3v and the equalize transistor PQ2v is connected to the read enable signal RDE. The precharge transistors PQ1v, PQ3v and the equalize transistor PQ2v are set to activated states by a non-selection level such as an "L" level of the read enable signal RDE.

The bit line pair VBT [0], VBB [0] is also connected to pull-up transistors PQ4v, PQ5v, each of which is composed of a P-channel MOS transistor. A source-drain path of the pull-up transistor PQ4v is connected between the power supply potential (voltage Vcc level) and the bit line VBB [0], and its gate is connected to the bit line VBT [0]. A source-drain path of the pull-up transistor PQ5v is connected between the power supply potential (voltage Vcc level) and the bit line VBT [0], and its gate is connected to the bit line VBB [0].

The VIO circuit (VIO) also has a buffer circuit BF5 for receiving the control signal RTE, and the buffer circuit BF5 outputs the control signal RT to the valid cell VC (VC0).

Figure 8:
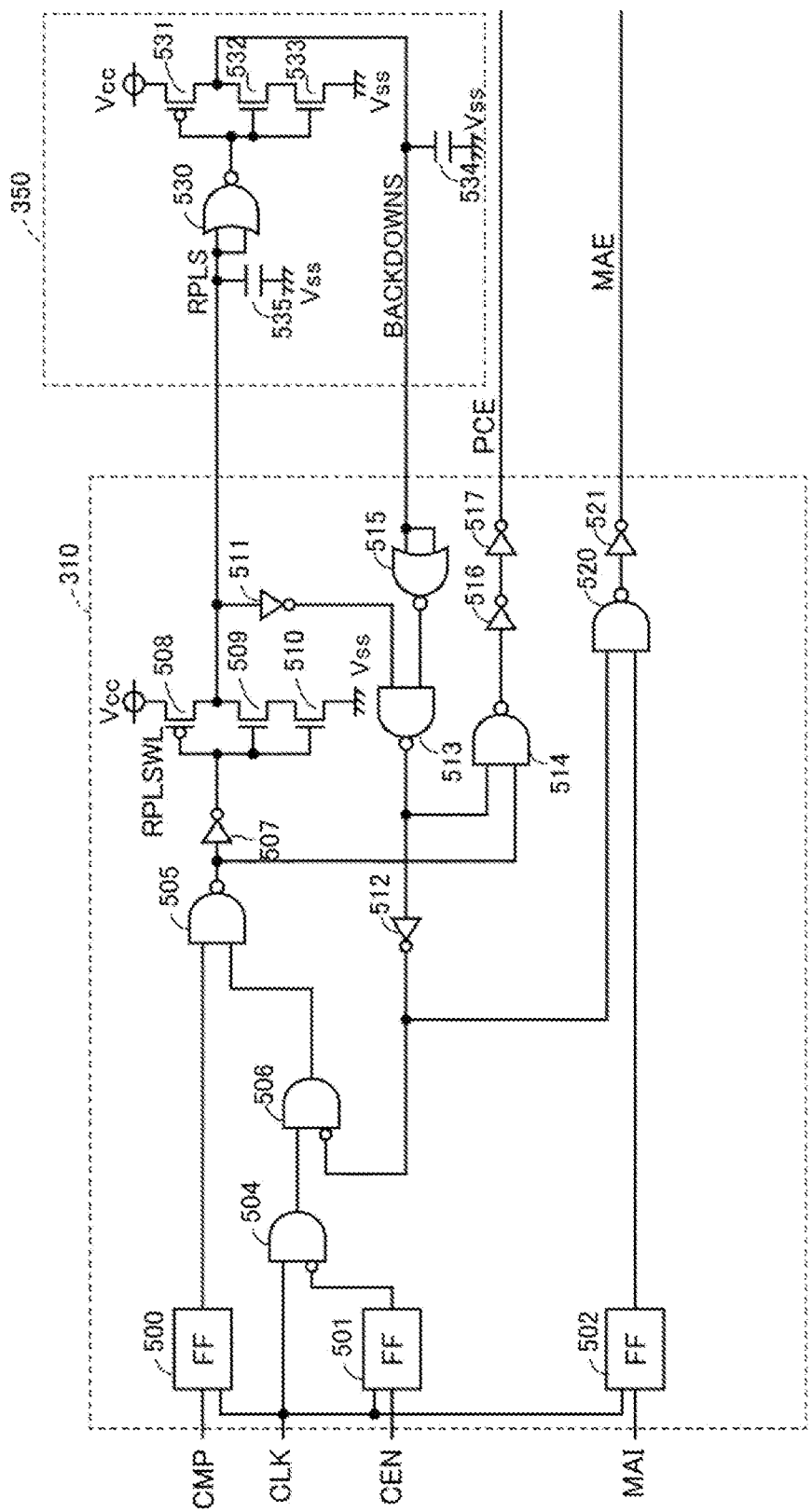
FIG. 8 is a diagram for explaining a first control logic circuit 310 and a match line load replica circuit 350 based on the first embodiment.

FIG. 8 is a diagram for explaining a first control logic circuit 310 and a match line load replica circuit 350 based on the first embodiment.

Referring to FIG. 8, a first control logic circuit 310 includes flip-flops (FF) 500 to 502, AND circuits 504, 506, NAND circuits 505, 513, 514, 520, inverters 507, 511, 512, 516, 517, 521, a NOR circuit 515, a P-channel MOS transistor 508, and N-channel MOS transistors 509, 510.

The flip-flops (FF) 500 to 503 take in control signals based on a clock signal CLK.

Specifically, the flip-flop (FF) 500 takes in a control signal CMP based on the clock signal CLK, and outputs it to the NAND circuit 505.

The flip-flop (FF) 501 takes in a control signal CEN based on the clock signal CLK, and outputs it to the AND circuit 504.

The flip-flop circuit (FF) 502 takes in a control signal MAI based on the clock signal CLK, and outputs it to the NAND circuit 520.

The AND circuit 504 receives inputs of the clock signal CLK and an inverted signal of an output of the flip-flop circuit (FF) 501, and outputs a result of an AND logic operation to the AND circuit 506.

The AND circuit 506 receives inputs of an output signal from the AND circuit 504 and an inverted signal of the NAND circuit 513 interposing the inverter 512, and outputs a result of an AND logical operation to the NAND circuit 505. The NAND circuit 505 receives inputs of the output signal of the flip-flop circuit (FF) 500 and the output signal of the AND circuit 506, and outputs a result of a NAND logical operation to the inverter 507. The inverter 507 inverts the output signal of the NAND circuit 505, and outputs it as a control signal RPLSWL.

The P-channel MOS transistor 508 and the N-channel MOS transistors 509, 510 are connected in series between the power supply potential (voltage Vcc level) and the ground potential (voltage Vss level), and each of their gates receives a signal input of the control signal RPLSWL. A control signal RPLS is transmitted from a connection node between the P-channel MOS transistor 508 and the N-channel MOS transistor 509. The inverter 511 inverts the control signal RPLS, and outputs it to the NAND circuit 513.

The NOR circuit 515 receives an input of a control signal BACKDOWNS and inverts it, and outputs it to the NAND circuit 513. The NAND circuit 513 receives an output of the NOR circuit 515 and an input of an inverted signal of the control signal RPLS interposing the inverter 511, and outputs a result of an NAND logical operation to the inverter 512 and the NAND circuit 514.

The inverter 512 inverts an output of the NAND circuit 513, and outputs it to the AND circuit 506. The NAND circuit 514 receives inputs of an output signal of the NAND circuit 513 and an output signal of the NAND circuit 505, and outputs a result of a NAND logical operation. The inverters 516, 517 output a signal input of the NAND circuit 514 as a control signal PCE.

The NAND circuit 520 receives inputs of an inverted signal of the NAND circuit 513 interposing the inverter 512 and an output signal of the flip-flop circuit (FF) 502, and outputs a result of a NAND logic operation as a control signal MAE interposing the inverter 521.

The match line load replica circuit 350 receives the input of the control signal RPLS, and outputs a first timing control signal BACKDOWNS based on a length of the match line ML.

The match line load replica circuit 350 includes capacitive elements 534, 535, a NOR circuit 530, a P-channel MOS transistor 531, and N-channel MOS transistors 532, 533.

The NOR circuit 530 inverts the input of the control signal RPLS, and outputs it.

The capacitive element 535 having the other electrode connected to the ground potential (voltage Vss level) is connected to an input node of the NOR circuit 530.

The P-channel MOS transistor 531 and the N-channel MOS transistors 532, 533 are connected in series between the power supply potential (voltage Vcc level) and the ground potential (voltage Vss level), and each of their gates receives the input of the output signal of the NOR circuit 530.

The control signal BACKDOWNS is transmitted from a connection node between the P-channel MOS transistor 531 and the N-channel MOS transistor 532. The capacitive element 534 having the other electrode connected to the ground potential (voltage Vss level) is connected to the connection node.

The capacitive elements 534, 535 are load capacities based on the length of the match line ML. The length of the match line ML differs from those of the memory block 202 and the memory block 203.

The memory block 202 includes 15-bit TCAM memory cells MC that are part of one row of entries. The memory block 203 includes the remaining 65-bit TCAM memory cells MC of one row of entries. Therefore, the match line ML of the memory block 202 is shorter than the match line ML of the memory block 203.

That is, the load capacities of the capacitive elements 534, 535 depend on the number of bits in a part of the entries in one row. The larger the number of bits, the larger a value of the load capacity, and the smaller the number of bits, the smaller the value of the load capacity.

Incidentally, in this example, a configuration in which two capacitive elements 534, 535 are provided in order to secure a margin has been described, but it may also be configured by one capacitive element.

Providing the match line load replica circuit 350 makes it possible to measure timing for identifying the potential of the match line ML due to the load of the match line ML when a plurality of search lines are driven during the retrieval operation.

Figure 9:
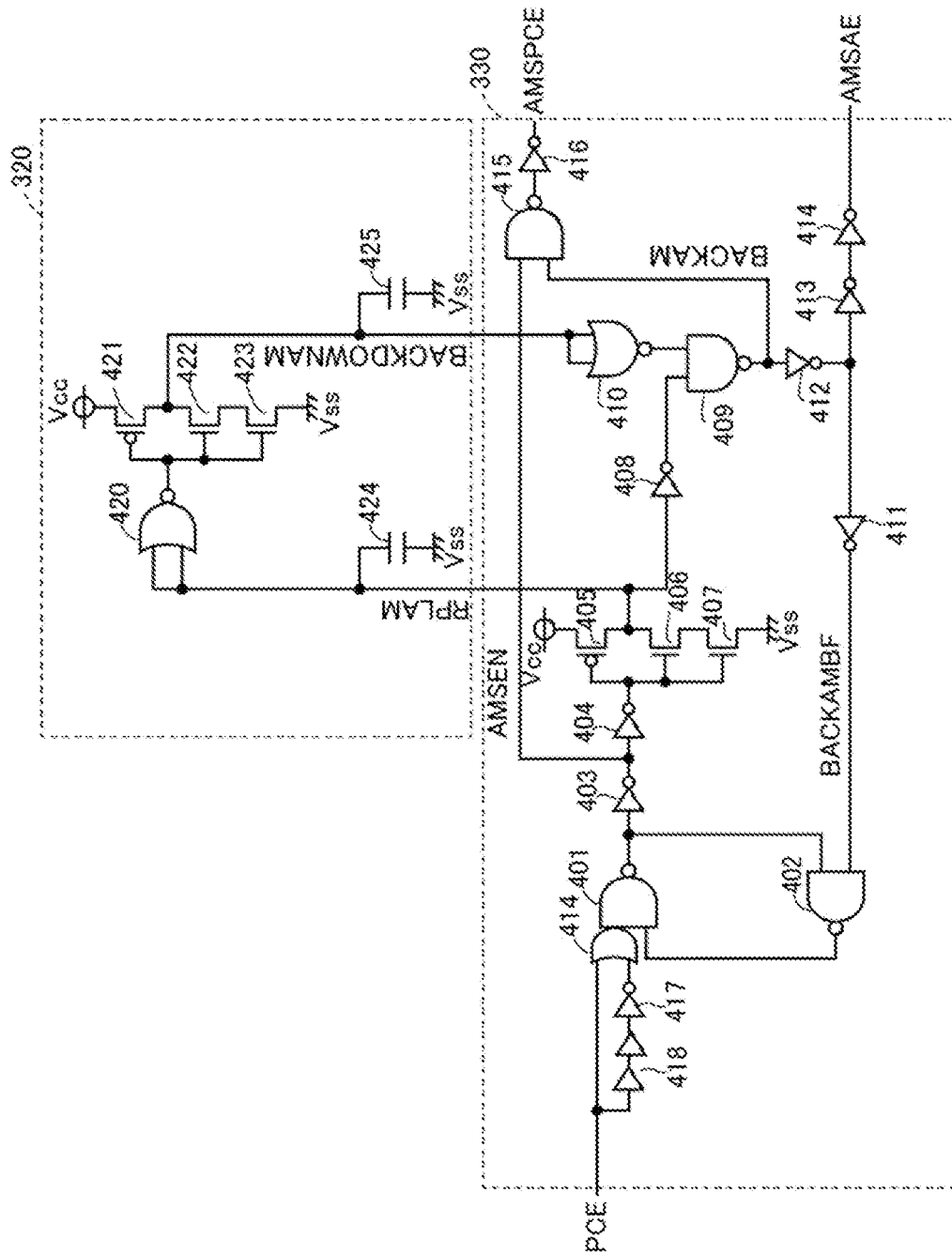
FIG. 9 is a diagram for explaining a second control logic circuit 330 and a match amplifier load replica circuit 320 based on the first embodiment.

FIG. 9 is a diagram for explaining a second control logic circuit 330 and a match amplifier load replica circuit 320 based on the first embodiment.

Referring to FIG. 9, a second control logic circuit 330 includes NAND circuits 401, 402, 409, 415; inverters 403, 404, 408, 411, 412, 413, 414, 416, 417; a NOR circuit 410; a P-channel MOS transistor 405; N-channel MOS transistors 406, 407; an OR circuit 414; and a delay circuit 418.

The OR circuit 414 outputs, to the NAND circuit 401, a result of an OR logic operation of inputs of the control signal PCE and the control signal PCE that has interposed the delay circuit 418 and the inverter 417.

The NAND circuit 401 receives inputs of an output signal from the OR circuit 414 and an output signal of the NAND circuit 402, and outputs a result of a NAND logic operation to the NAND circuit 402 and the inverter 403. The NAND circuit 402 receives outputs of an output signal of the NAND circuit 401 and the control signal BACKAMBF, and outputs a result of the NAND logic operation to the NAND circuit 401.

The inverter 403 inverts the output signal of the NAND circuit 401, and outputs it as a control signal AMSEN. The inverter 404 inverts and outputs the control signal AMSEN.

The P-channel MOS transistor 405 and the N-channel MOS transistors 406, 407 are connected in series between the power supply potential (voltage Vcc level) and the ground potential (voltage Vss level), and each of their gates receives the signal input of the control signal AMSEN interposing the inverter 404. The control signal RPLAM is transmitted from a connection node between the P-channel MOS transistor 405 and the N-channel MOS transistor 406. The inverter 408 inverts the control signal RPLAM, and outputs it to the NAND circuit 409.

The NAND circuit 415 receives inputs of the control signal AMSEN and the control signal BACKAM, and outputs the result of the NAND logic operation as a control signal AMSPCE interposing the inverter 416.

The NOR circuit 410 receives the input of the control signal BACKDOWNAM, inverts it, and outputs it to the NAND circuit 409. The NAND circuit 409 receives the output of NOR circuit 410 and the input of the inverted signal of control signal RPLAM interposing the inverter 408, and outputs the result of the NAND logic operation as the control signal BACKAM.

The inverters 411, 412 output the control signal BACKAM as the control signal BACKAMBF.

The inverters 411, 412, 413 output the control signal BACKAM as the control signal AMSAE.

The match amplifier load replica circuit 320 receives the input of the control signal RPLAM, and outputs a second timing control signal BACKDOWNAM based on the number of match amplifiers.

The match amplifier load replica circuit 320 includes capacitive elements 424, 425, a NOR circuit 420, a P-channel MOS transistor 421, and N-channel MOS transistors 422, 423.

The NOR circuit 420 inverts the input of the control signal RPLAM, and outputs it.

A capacitive element 424 having the other electrode connected to the ground potential (voltage Vss level) is connected to an input node of the NOR circuit 420.

The P-channel MOS transistor 421 and the N-channel MOS transistors 422, 423 are connected in series between the power supply potential (voltage Vcc level) and the ground potential (voltage Vss level), and each of their gates receives the input of the output signal of the NOR circuit 420.

The control signal BACKDOWNAM is transmitted from a connection node between the P-channel MOS transistor 421 and the N-channel MOS transistor 422. A capacitive element 525 having the other electrode connected to the ground potential (voltage Vss level) is connected to the connection node.

The capacitive elements 424, 425 are load capacities based on the number of match amplifiers. The number of match amplifiers depends on the number of entries. In this example, it is 256 entries, and the load capacity is set depending on the number of entries mentioned above. The larger the number of entries included in the memory block, the larger a value of the load capacity, and the smaller the number of entries, the smaller the value of the load capacity.

Incidentally, in this example, a configuration in which two capacitive elements 424, 425 are provided in order to secure a margin has been described, but it may be configured by one capacitive element.

Providing the match amplifier load replica circuit 320 makes it possible to measure timing for identifying a potential of a determination line GML due to the loads of the plurality of match amplifiers when the plurality of match amplifiers are driven during the retrieval operation.

Figure 10:
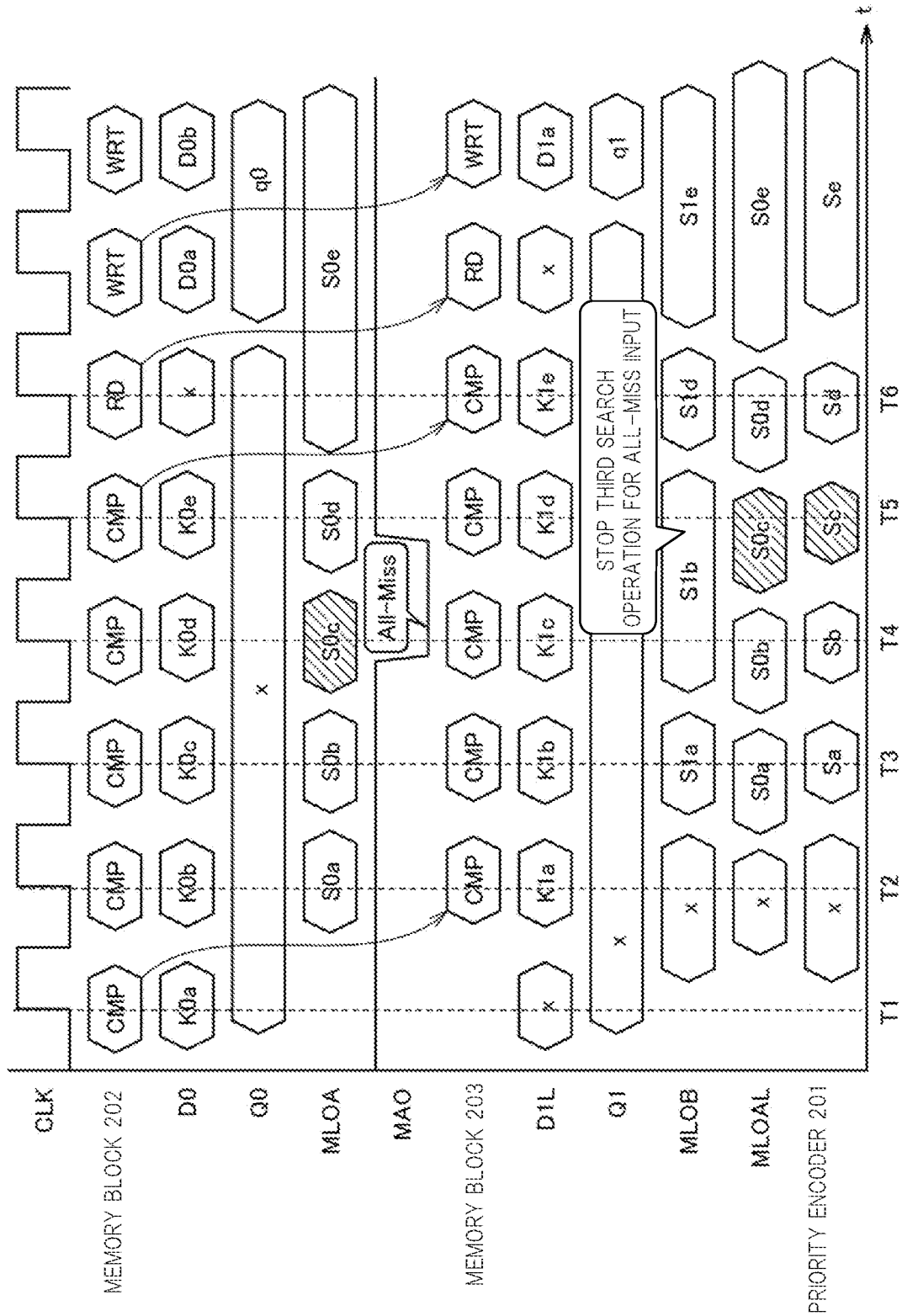
FIG. 10 is a timing chart for explaining operation timing of the semiconductor device based on the embodiment.

FIG. 10 is a timing chart for explaining operation timing of the semiconductor device based on the embodiment.

Referring to FIG. 10, shown is a case where the semiconductor device is operating in synchronization with the clock signal CLK. In this example, a case of operating in synchronization with a rising of the clock signal CLK is shown.

At time T1, the retrieval operation of the memory block 202 is executed in synchronization with the rising of the clock signal CLK. Further, at that time, the retrieval operation is performed by receiving an input of retrieval data ("K0a") of the memory block 202 from a retrieval data input circuit 990.

After time T1, between time T1 and time T2, a result ("S0a") of the match line MLOA of the memory block 202 is outputted as a result of the retrieval operation.

At time T2, the retrieval operation of the memory block 203 is executed in synchronization with the next rising of the clock signal CLK. At that time, the retrieval operation is executed by receiving an input of retrieval data ("K1a") of the memory block 203 delayed by one clock from the retrieval data input circuit 990. As one example, the retrieval data ("K0a") is 15 bits and the retrieval data ("K1a") is 65 bits.

After time T2, between time T2 and time T3, a result ("S1a") of the match line MLOB of the memory block 203 is outputted as a result of the retrieval operation. Then, inputted to an integrated circuit 212 are a transmission result MLOAL of the match line MLOA and the match line MLOB.

At time T3, an address ("Sa") is outputted from a priority encoder 201.

The next retrieval operation is also executed in the same way.

Specifically, at time T2, the retrieval operation of the memory block 202 is executed in synchronization with the rising of the clock signal CLK. Further, at that time, the retrieval operation is executed by receiving an input of retrieval data ("K0b") of the memory block 202 from the retrieval data input circuit 990.

After time T2, between time T2 and time T3, a result ("S0b") of the match line MLOA of the memory block 202 is outputted as a result of the retrieval operation.

At time T3, the retrieval operation of the memory block 203 is executed in synchronization with the next rising of the clock signal CLK. At that time, the retrieval operation is executed by receiving an input of the retrieval data ("K1b") of the memory block 203 delayed by one clock from the retrieval data input circuit 990. As one example, the retrieval data ("K0b") is 15 bits and the retrieval data ("K1b") is 65 bits.

After time T3, between time T3 and time T4, a result ("S1b") of the match line MLOB of the memory block 203 is outputted as a result of the retrieval operation. Then, inputted to the integrated circuit 212 are a transmission result MLOAL of the match line MLOA and the result of the match line MLOB.

At time T4, an address ("Sb") is outputted from the priority encoder 201.

Next, described will be a case where all the entries are mismatch (All-miss) as a retrieval operation of the memory block 202.

At time T3, the retrieval operation of the memory block 202 is executed in synchronization with the rising of the clock signal CLK. Further, at that time, the retrieval operation is executed by receiving an input of retrieval data ("K0c") of the memory block 202 from the retrieval data input circuit 990.

After time T3, between time T3 and time T4, a result ("S0c") of the match line MLOA of the memory block 202 is outputted as a result of the retrieval operation.

At that time, since all the match signal output lines MLO are at "L" levels, the retrieval operation of the subsequent memory block 203 is stopped according to the determination signal MAO ("L" level).

That is, at time T4, the retrieval operation of the memory block 203 is stopped in synchronization with the next rising of the clock signal CLK.

An input of retrieval data ("K1c") of the memory block 203 delayed by one clock from the retrieval data input circuit 990 is received, but the retrieval operation is not executed. As one example, the retrieval data ("K0b") is 15 bits and the retrieval data ("K1b") is 65 bits.

After time T4, between time T4 and time T5, no retrieval operation is executed, and a result ("S1b") of the match line MLOB of the memory block 203 is maintained as a result of the previous retrieval operation. Then, the transmission result MLOAL of the match line MLOA and the result of the match line MLOB are inputted to the integrated circuit 212.

At time T5, an address ("Sc") is outputted from the priority encoder 201. In this case, as a result of the retrieval operation of the memory block 202, a result ("S0c") of a case where all the entries are a mismatch is inputted to the integrated circuit 212, so that a correct address ("Sc") indicating the mismatch from the priority encoder 201 can be outputted.

Next, at time T4, the retrieval operation of the memory block 202 is executed in synchronization with the rising of the clock signal CLK. Further, at that time, the retrieval operation is executed by receiving an input of retrieval data ("K0d") of the memory block 202 from the retrieval data input circuit 990.

After time T4, between time T4 and time T5, a result ("S0d") of the match line MLOA of the memory block 202 is outputted as a result of the retrieval operation.

At time T5, a retrieval operation of the memory block 203 is executed in synchronization with the next rising of the clock signal CLK. At that time, the retrieval operation is executed by receiving an input of retrieval data ("K1d") of the memory block 203 delayed by one clock from the retrieval data input circuit 990. As one example, the retrieval data ("K0d") is 15 bits and the retrieval data ("K1d") is 65 bits.

After time T5, between time T5 and time T6, a result ("S1d") of the match line MLOB of the memory block 203 is outputted as a result of the retrieval operation. Then, inputted to the integrated circuit 212 are the transmission result MLOAL of the match line MLOA and the result of the match line MLOB.

At time T6, an address ("Sd") is outputted from the priority encoder 201.

Figure 11:
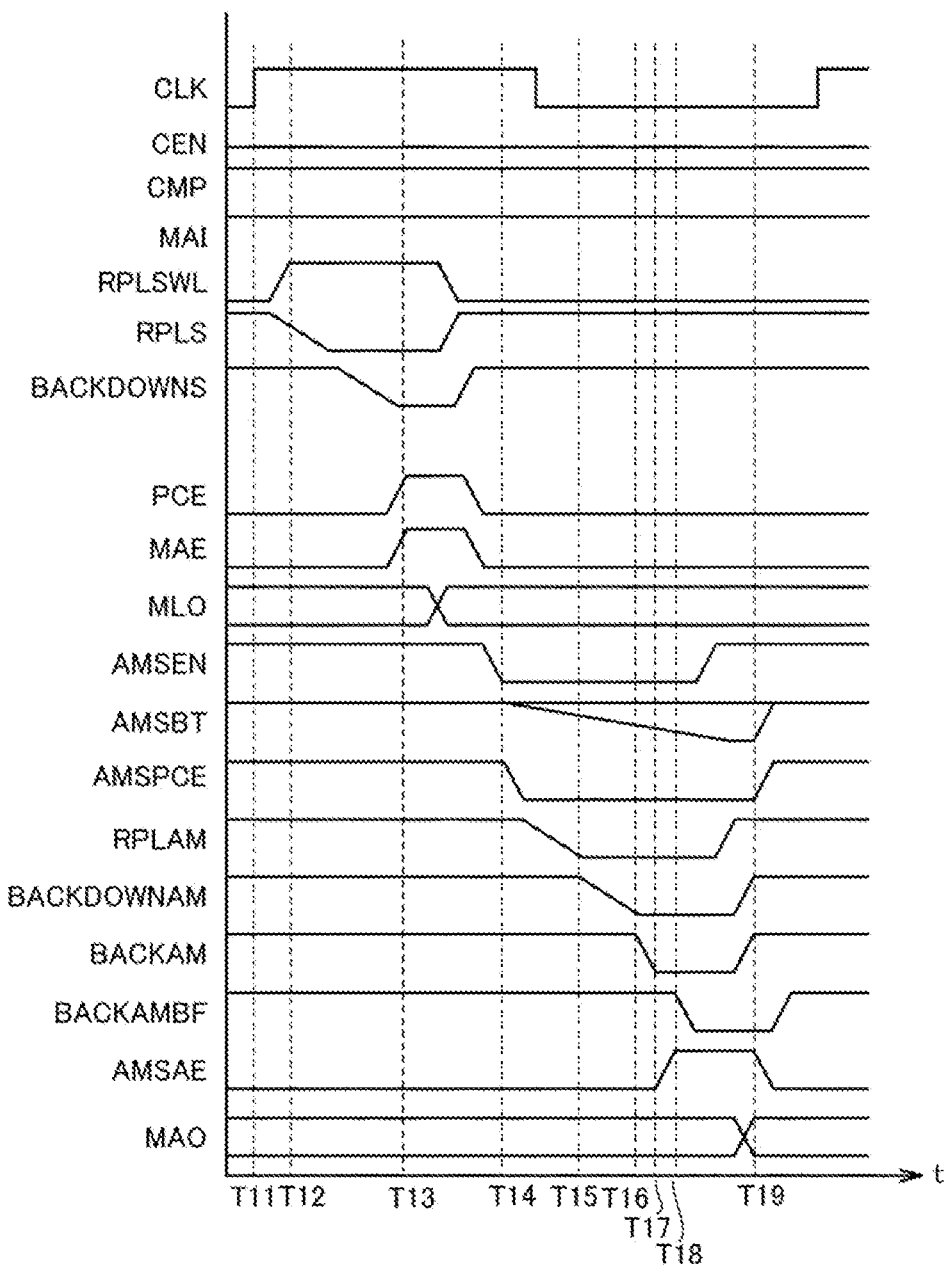
FIG. 11 is a timing chart for explaining transitions of various control signals of one clock during a retrieval operation of the semiconductor device based on the embodiment.

FIG. 11 is a timing chart for explaining transitions of various control signals for one clock during a retrieval operation of the semiconductor device based on the embodiment. As one example, the operation of the memory block 202 will be described.

Referring to FIG. 11, at time T11, the retrieval operation of the memory block 202 is executed in synchronization with the rising of clock signal CLK.

Specifically, in synchronization with the rising ("H" level) of the clock signal CLK, the flip-flops (FF) 500, 501 take in a control signal CMP ("H" level) and a control signal CEN ("L" level).

Then, at time T12, the control signal RPLSWL is set to an "H" level. Along with this, the first control logic circuit 310 outputs a control signal RPLS to the match line load replica circuit 350.

Also, although not shown, search data is inputted to the IO circuit IO, a search line driver SD is driven, and the above-described retrieval operation of the TCAM cell MC is executed.

The match line load replica circuit 350 receives an input of the control signal RPLS, and outputs the first timing control signal BACKDOWNS based on a length of the match line ML at time T13.

The first control logic circuit 310 raises the control signals PCE ("H" level) and MAE ("H" level) in response to the input of the first timing control signal BACKDOWNS.

While the first control logic circuit 310 outputs the control signal RPLS to receive the input of the first timing control signal BACKDOWNS, the retrieval operation of the TCAM cell MC is executed and the value of the match line MLA is identified as the "H" level or "L" level.

A match line output circuit MO outputs a detection signal ("H" level/"L" level) based on the potential of the match line MLA in response to the control signals PCE ("H" level) and MAE ("H" level).

Then, a determination unit TD operates.

The determination line GML is precharged by the precharge circuit 340. Specifically, it is precharged to the power supply potential (voltage Vcc level). The N-channel MOS transistor TL0 is turned on according to the input of the control signal MAE ("H" level). In addition, the N channel MOS transistor TM0 is turned on according to the potential of the match signal output line MLO.

Meanwhile, the second control logic circuit 330 receives an input of the control signal PCE and, at time T14, the control signal AMSEN is set to an "L" level.

Also, along with this, a control signal AMSPCE outputted from the second control logic circuit 330 is set to an "L" level.

The precharge circuit 340 operates in response to the control signal AMSPCE, precharges the determination line GML to the power supply potential (voltage Vcc level) in response to the control signal AMSPCE ("H" level), and stops precharging the determination line GML in response to the control signal AMSPCE ("L" level).

Therefore, the precharge circuit 340 stops precharging the determination line GML in response to the control signal AMSPCE ("L" level), and the determination line GML transitions according to the operation of the determination unit TD.

For example, when at least one match signal output line MLO is at the "H" level, that is, when some entries are the match, the determination line GML becomes the ground potential (voltage Vss level) and the control signal AMSBT is set to the "L" level. Meanwhile, when all the match signal output lines MLO are at the "L" levels, that is, when all of some entries are the mismatch, the determination line GML maintains the power supply potential (voltage Vcc level). The control signal AMSBT is set to the "H" level.

Also, the second control logic circuit 330 outputs the control signal RPLAM to the match amplifier load replica circuit 320 at time T15.

At time T16, the match amplifier load replica circuit 320 receives the input of the control signal RPLAM, and outputs a second timing control signal BACKDOWNAM based on the number of match amplifiers.

At time T17, the second control logic circuit 330 outputs the control signal BACKAM ("L" level) in response to the input of the second timing control signal BACKDOWNAM.

While the second control logic circuit 330 outputs the control signal RPLAM and receives the input of the second timing control signal BACKDOWNAM, a value of the control signal AMSBT of the determination line GML is set to an "H" level or "L" level.

The second control logic circuit 330 raises the control signal AMSAE ("H" level) at time T18. The latch circuit 360 latches the control signal AMSBT in response to the control signal AMSAE ("H" level), and outputs the determination signal MAO at time T19.

As shown in this processing, it is possible to output the determination signal MAO, which is the result of the retrieval operation of the memory block 202, to the subsequent memory block 203 within one clock and to stop the retrieval operation of the memory block 203 by the processing to perform a high-speed search operation. Further, setting the match line of the preceding memory block 202 so as to become shorter than that of the subsequent memory block 203 makes it possible to stop the retrieval operation of the subsequent memory block 203 early and, in addition thereto, to reduce power consumption.

Conventionally, when the configuration of the preceding memory block is different from that of the subsequent memory block, their timing control is different from each other, so that the high-speed retrieval operation cannot be executed. By providing the match line load replica circuit 350 and the match amplifier load replica circuit 320 to generate first and second timing control signals as in the configuration according to the first embodiment, the timing control according to the configuration of each memory block can be performed.

Incidentally, in this example, a two-stage pipeline configuration has been described by dividing the memory array into two, but the number of stages is not limited to two and, of course, a three or more-stage pipeline configuration can also be adopted by dividing it into further two or more.

Second Embodiment

In a second embodiment, a simulation device used for simulating the semiconductor device according to the first embodiment will be described. A semiconductor system is realized in combination with the semiconductor device.

Figure 12:
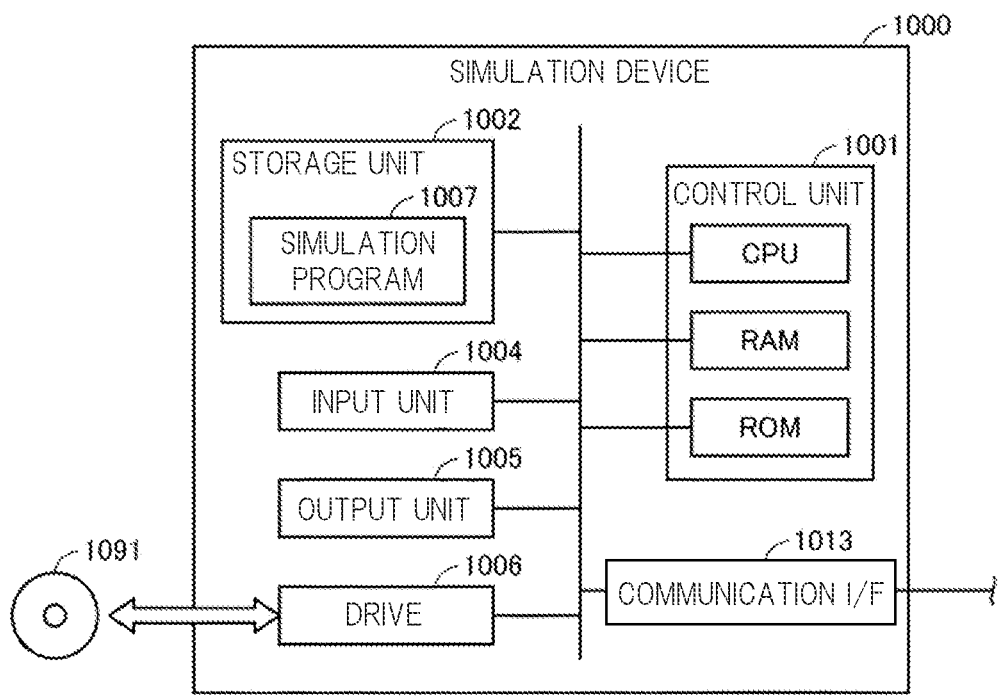
FIG. 12 is a diagram schematically illustrating one example of a hardware configuration of a simulation device 1000 according to a second embodiment.

FIG. 12 is a diagram schematically illustrating one example of a hardware configuration of a simulation device 1000 according to a second embodiment. As shown in FIG. 12, a simulation device 1000 according to a second embodiment is a computer to which a control unit 1001, a storage unit 1002, a communication interface 1013, an input unit 1004, an output unit 1005, and a drive 1006 are electrically connected. Incidentally, in FIG. 12, the communication interface is described as "communication I/F".

The control unit 1001 is a CPU (Central Processing Unit) serving as a hardware processor, a RAM (Random Access Memory), a ROM (Read Only Memory), and the like, and controls each component according to an information processing(s). The storage unit 1002 is, for example, an auxiliary storage device such as a hard disk drive or a solid state drive, and stores a simulation program 1007 or the like executed by the control unit 1001.

The simulation program 1007 is a program for causing the simulation device 1000 to execute a processing for analyzing a design model of a semiconductor device by using design data, various parameter information, or the like of the semiconductor device about manufacture of the semiconductor device.

The communication interface 1013 is, for example, a wired LAN (Local Area Network) module, a wireless LAN module, or the like, and is an interface for performing wired or wireless communication via a network. The simulation device 1000 can perform data communication with an external communication device (server or the like) via a network by this communication interface 1013. Incidentally, a type of the network may be appropriately selected from, for example, the Internet, a wireless communication network, a mobile communication network, a telephone network, a dedicated network, and the like.

The input unit 1004 is, for example, a unit for performing an input such as a mouse or a keyboard. Also, the output unit 1005 is, for example, a unit for performing an output such as a display or a speaker.

The user can operate the simulation device 1000 via the input unit 1004 and the output unit 1005.

The drive 1006 is, for example, a CD drive, a DVD drive, or the like, and is a drive unit for reading programs stored in a storage medium 1091. A type of the drive 1006 may be appropriately selected according to a type of the storage medium 1091. The above-mentioned simulation program 1007 may be stored in this storage medium 1091. Further, various pieces of design data, various parameters, or the like used in the simulation program 1007 may also be stored in the storage medium 1091.

The storage medium 1091 is a medium for accumulating information such as programs by electrical, magnetic, optical, mechanical or chemical action so as to be able to read information such as programs in which computers, other devices, and machines, etc. are recorded.

Here, as one example of the storage medium 1091, a disk-type storage medium such as a CD or DVD is exemplified. However, a type of the storage medium 1091 is not limited to a disk type, and may be a type other than the disk type. As a storage medium other than the disk type, for example, a semiconductor memory such as a flash memory can be given.

Incidentally, regarding the specific hardware configuration of the simulation device 1000, omission, replacement, and addition of a component(s) become appropriately possible according to the embodiment. For example, the control unit 1001 may include a plurality of processors. The simulation device 1000 may be composed of a plurality of information processing devices. Further, the simulation device 1000 may be a general-purpose server device, a PC (Personal Computer), or the like besides an information processing device designed for simulation.

Figure 13:
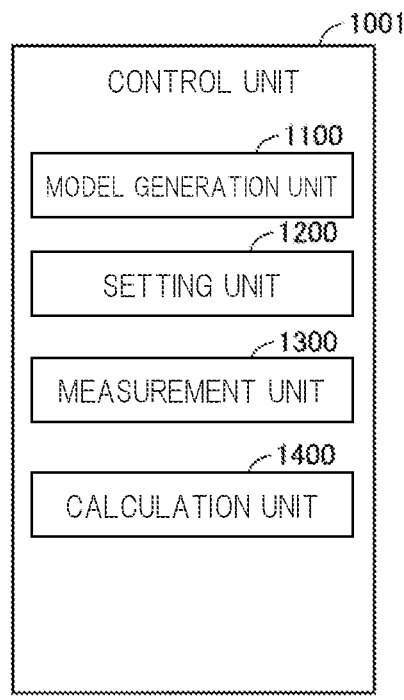
FIG. 13 is a diagram for explaining functional blocks of a control unit 1001 according to the second embodiment.

FIG. 13 is a diagram for explaining functional blocks of the control unit 1001 according to the second embodiment.

With reference to FIG. 13, the control unit 1001 includes a model generation unit 1100, a setting unit 1200, a measurement unit 1300, and a calculation unit 1400.

Various functional blocks of the control unit 1001 are realized by executing the simulation program 1007.

The model generation unit 1100 generates a model of a semiconductor device based on design data and various parameters, etc.

The setting unit 1200 sets the division number of memory array in the model generated by the model generation unit 1100.

The setting unit 1200 is provided so as to be settable in accordance with input acceptance interposing the input unit 1004 of the user.

The measurement unit 1300 measures respective signal states of output terminals of the search lines and the match lines of the divided memory blocks according to the setting of the setting unit 1200.

The calculation unit 1400 calculates power consumption according to the number of divisions of the memory array.

Figure 14:
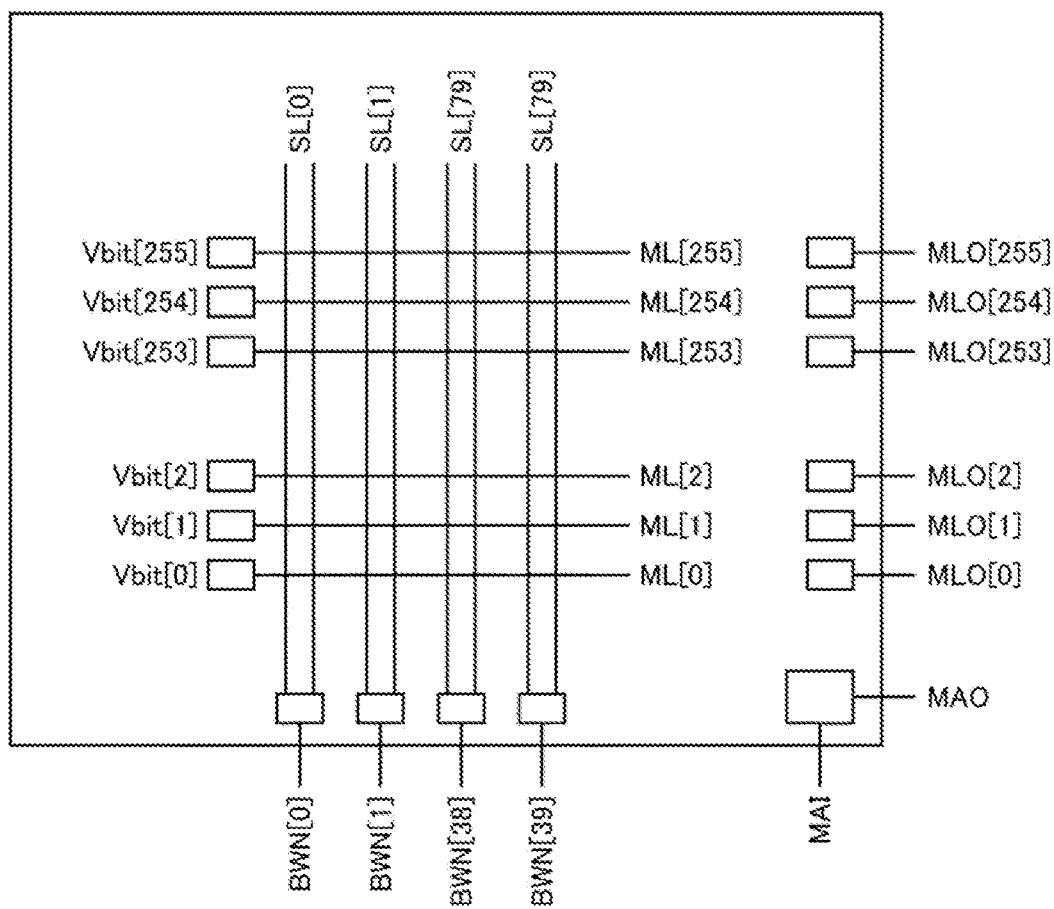
FIG. 14 is a diagram for explaining one example of a model of a semiconductor device generated by a model generation unit 1100.

FIG. 14 is a diagram for explaining one example of a model of a semiconductor device generated by the model generation unit 1100.

Referring to FIG. 14, in this example, the generated model shows a case where output terminals are respectively provided for the match line ML, the match signal output line MLO, the search line SL, and the like.

Providing the respective output terminals makes it possible to grasp transition states of the various signal lines.

That is, the transition states of the various signal lines can be measured by providing output terminals for each of the 80-bit search line and the 256-bit match line.

Figure 15:
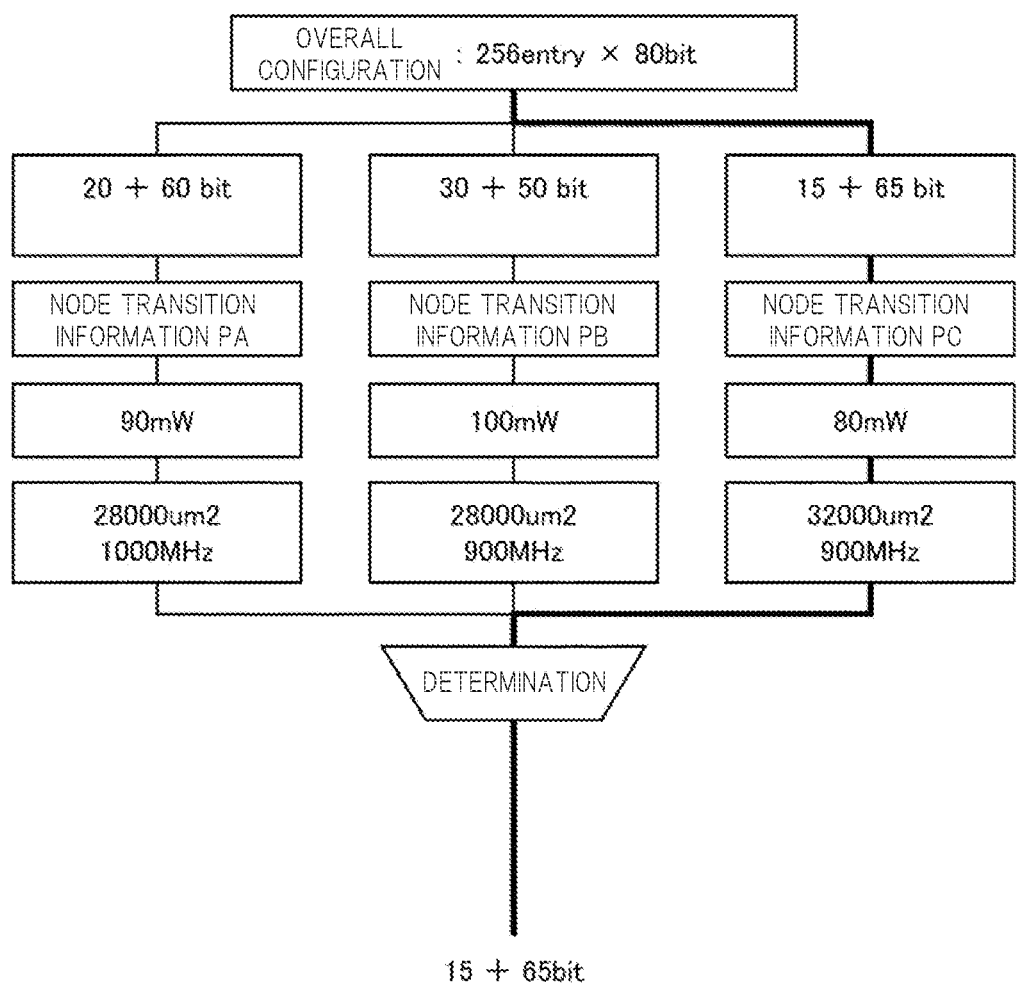
FIG. 15 is a conceptual diagram for explaining a simulation example of the simulation device 1000 according to the second embodiment.

FIG. 15 is a conceptual diagram for explaining a simulation example of the simulation device 1000 according to the second embodiment.

With reference to FIG. 15, considered is a design for a configuration of 80 bits and 256 entries as a memory array, for example.

The user can set the division number of memory array with the setting unit 1200 via the input unit 1004.

In this example, as pattern 1, a configuration of 20-bit and 60-bit memory blocks is set. As pattern 2, a configuration of 30-bit and 50-bit memory blocks is set. As pattern 3, a configuration of 15-bit and 65-bit memory blocks is set.

Node transition information is inputted to the measurement unit 1300 to measure signal states according to patterns of various memory blocks.

As one example, shown is a case where node transition information PA, PB, PC are respectively inputted.

The calculation unit 1400 measures the power consumption based on the node transition information PA, PB, PC in the memory blocks divided into various patterns.

Specifically, as described with reference to FIG. 14, the calculation unit 1400 calculates the power consumption according to a result based on the transition states of the output terminals provided to the match line ML, the match signal output line MLO, the search line SL, and the like.

The calculation unit 1400 also calculates an area and a frequency in a case of designing a memory block at each set pattern.

Then, the simulation device 1000 outputs a determination result.

In this example, shown is a case where the memory block of 15+65 bits, which is pattern 3 and has the lowest power consumption, is outputted as a determination result.

With this configuration, the user can arbitrarily set the division number of memory array by setting the setting unit 1200 via the input unit 1004, thereby being able to calculate calculation results of the power consumption, the area, and the frequency.

This makes it possible to easily design the desired semiconductor device.

Incidentally, in this example, a case of outputting the determination result giving priority to power consumption has been described. However, the present invention is not limited to this, and may give priority to a frequency, give priority to an area, or output a result obtained by combining these.

As described above, the present disclosure has been specifically explained based on the embodiments, but the present disclosure is not limited to the embodiments and, needless to say, can variously be modified within a range not departing from the scope thereof.

What is claimed is:
1. A semiconductor device comprising:
   a memory array including a plurality of associative memory cells arranged in a matrix form for storing entries,
   wherein the memory array is divided into a plurality of memory blocks that sequentially perform a retrieval operation along a column direction, the memory array further includes:
- a plurality of match lines provided correspondingly to the respective memory blocks and correspondingly to each of memory cell rows;
- a plurality of search lines provided correspondingly to the respective memory blocks and correspondingly to each of memory cell columns; and
- a plurality of match amplifiers corresponding to the respective memory blocks and respectively provided in the plurality of match lines, wherein the match lines provided correspondingly to a preceding memory block is set to be shorter than the match line provided correspondingly to a subsequent memory block, and wherein the memory array further includes a timing control unit for controlling timing of driving the search line of the subsequent memory block based on a length of the match line provided correspondingly to the preceding memory block.

2. The semiconductor device according to claim 1,
wherein the timing control unit includes a first replica circuit that outputs a first timing control signal based on the length of the match line provided correspondingly to the preceding memory block.

3. The semiconductor device according to claim 2,
wherein the timing control unit further includes a second replica circuit that outputs a second timing control signal based on a number of the plurality of match amplifiers provided correspondingly to the preceding memory block.

4. The semiconductor device according to claim 3,
wherein the second replica circuit operates based on the first timing control signal.

5. The semiconductor device according to claim 4,
wherein the timing control unit further includes a determination circuit for determining that all of some entries stored in each of the memory blocks by the retrieval operation according to the second timing control signal are a mismatch, and
wherein drive of the search line of the subsequent memory block is stopped based on a determination result of the determination circuit.

6. The semiconductor device according to claim 5,
wherein the determination circuit includes:
- a determination line precharged at a first potential; and
- a plurality of determination units provided correspondingly to each of the plurality of match amplifiers, each of plurality of determination units setting the determination line at a second potential based on the determination result of the mismatch of the corresponding match amplifier.

7. A semiconductor system further comprising a simulation device used for simulation of the semiconductor device according to claim 1.

8. The semiconductor system according to claim 7,
wherein the simulation device includes:
- a model generation unit generating a model of the semiconductor device;
- a setting unit capable of setting a number of divisions of the memory array in the model generated by the model generation unit;
- a measurement unit measuring each signal state of output terminals of search lines and match lines of the divided memory blocks; and
- a calculation unit calculating power consumption according to the number of divisions of memory array.

* * * * *